United States Patent
Murayama et al.

(10) Patent No.: US 9,740,095 B2
(45) Date of Patent: Aug. 22, 2017

(54) GREEN COLORING COMPOSITION FOR USE IN COLOR FILTER, COLORED FILM, COLOR FILTER, AND SOLID-STATE IMAGING DEVICE

(71) Applicant: FUJIFILM Corporation, Tokyo (JP)

(72) Inventors: Satoru Murayama, Haibara-gun (JP); Kazuto Shimada, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/215,656

(22) Filed: Jul. 21, 2016

(65) Prior Publication Data
US 2016/0327860 A1 Nov. 10, 2016

Related U.S. Application Data

(63) Continuation of application No. PCT/JP2015/052507, filed on Jan. 29, 2015.

(30) Foreign Application Priority Data

Jan. 31, 2014 (JP) .................................. 2014-017894

(51) Int. Cl.
*G02B 5/20* (2006.01)
*G03F 7/00* (2006.01)
(Continued)

(52) U.S. Cl.
CPC ............ *G03F 7/0007* (2013.01); *C09B 23/00* (2013.01); *G02B 5/208* (2013.01); *G02B 5/223* (2013.01);
(Continued)

(58) Field of Classification Search
CPC ........ G03F 7/0007; G03F 7/027; G03F 7/105; G02B 5/223; G02B 5/208; H01L 27/14
(Continued)

(56) References Cited

U.S. PATENT DOCUMENTS

| | | |
|---|---|---|
| 2007/0109548 A1 | 5/2007 | Uchida |
| 2010/0248095 A1 | 9/2010 | Aoyagi |
| 2011/0070407 A1 | 3/2011 | Kato et al. |

FOREIGN PATENT DOCUMENTS

| | | |
|---|---|---|
| JP | 9-203808 A | 8/1997 |
| JP | 2001-131440 A | 5/2001 |

(Continued)

OTHER PUBLICATIONS

Computer-generated translation of JP 2003-222719 (Aug. 2003).*
(Continued)

*Primary Examiner* — John A McPherson
(74) *Attorney, Agent, or Firm* — Sughrue Mion, PLLC

(57) ABSTRACT

The present invention provides a green coloring composition for use in a color filter, which can form a green colored film having low incident-angle dependence and improves the color-separation properties of a solid-state imaging device including the colored film; and a colored film, a color filter, and a solid-state imaging device. The green coloring composition for use in a color filter of the present invention is a green coloring composition for use in a color filter, containing a green colorant, a near-infrared absorbent, and a polymerizable compound, in which when the green coloring composition for use in a color filter is used to form a colored film having a film thickness of 0.8 µm, the maximum value of the transmittance at a wavelength from 400 nm to 450 nm of the colored film is 5% or less, the maximum value of the transmittance at a wavelength from 500 nm to 600 nm of the colored film is 70% or more, the minimum value of the transmittance at a wavelength from 650 nm to less than 700 nm of the colored film is 20% or less, and the minimum value of the transmittance at a wavelength from 700 nm to 900 nm of the colored film is 30% or less.

19 Claims, 1 Drawing Sheet

(51) Int. Cl.
*C09B 23/00* (2006.01)
*H01L 27/14* (2006.01)
*G02B 5/22* (2006.01)
*G03F 7/027* (2006.01)
*G03F 7/105* (2006.01)

(52) U.S. Cl.
CPC .............. *G03F 7/027* (2013.01); *G03F 7/105* (2013.01); *H01L 27/14* (2013.01)

(58) Field of Classification Search
USPC ...................................... 430/7, 270.1, 281.1
See application file for complete search history.

(56) References Cited

FOREIGN PATENT DOCUMENTS

| JP | 2003-222719 A | * | 8/2003 |
|---|---|---|---|
| JP | 2007-141876 A | | 6/2007 |
| JP | 2009-244791 A | | 10/2009 |
| JP | 2010-145787 A | | 7/2010 |
| JP | 2010-256868 A | | 11/2010 |
| JP | 2011-68731 A | | 4/2011 |

OTHER PUBLICATIONS

International Search Report of PCT/JP2015/052507, dated Apr. 21, 2015. [PCT/ISA/210].
Written Opinion of PCT/JP2015/052507, dated Apr. 21, 2015. [PCT/ISA/237].
International Preliminary Report on Patentability and Written Opinion, issued Aug. 11, 2016, in International Application No. PCT/JP2015/052507, 10 pages in English.
Notification of Reasons for Refusal, issued Dec. 6, 2016, in corresponding JP Application No. 2015-015502, 6 pages in English and Japanese.
Communication dated Apr. 3, 2017, issued by the Korean Intellectual Property Office in corresponding Korean Application No. 10-2016-7018089.

* cited by examiner

GREEN COLORING COMPOSITION FOR USE IN COLOR FILTER, COLORED FILM, COLOR FILTER, AND SOLID-STATE IMAGING DEVICE

CROSS-REFERENCE TO RELATED APPLICATIONS

This application is a Continuation of PCT International Application No. PCT/JP2015/052507 filed on Jan. 29, 2015, which claims priority under 35 U.S.C. §119(a) to Japanese Patent Application No. 2014-017894 filed on Jan. 31, 2014. The above application is hereby expressly incorporated by reference, in its entirety, into the present application.

BACKGROUND OF THE INVENTION

1. Field of the Invention

The present invention relates to a green coloring composition for use in a color filter, a colored film, a color filter, and a solid-state imaging device.

2. Description of the Related Art

A color filter is an essential component for a liquid crystal display or a solid-state imaging device.

Such a color filter is constituted with colored patterns (filter segments) in a plurality of colors, and usually forms colored regions (hereinafter also referred to as "filter segments") in at least red, green, and blue.

A number of compositions for forming such a filter segment have been proposed from the related art (for example, JP2010-256868A).

SUMMARY OF THE INVENTION

On the other hand, devices including solid-state imaging devices such as digital cameras have recently been required to be smaller and thinner, and correspondingly, required to have low incident-angle dependence (suppressed incident-angle dependence).

The present inventors have investigated incident-angle dependence of light with respect to a film (colored film) of a green filter segment formed using the coloring composition described in JP2010-256868A, and as a result, they have observed significant distortion (shift) of absorbance wavelength by a light incidence angle, and a change in tint. That is, significant (high) incident-angle dependence was observed.

Furthermore, as the characteristics of a green filter segment, excellent color-separation properties of various devices such as a solid-state imaging device including a green filter segment are also demanded.

The present invention has been made taking into consideration these circumstances, and has an object to provide a green coloring composition for use in a color filter, which is capable of forming a green colored film having low incident-angle dependence, and improves the color-separation properties of a solid-state imaging device including the colored film.

In addition, the present invention also has an object to provide a colored film, a color filter, and a solid-state imaging device, each of which is formed by using the green coloring composition for use in a color filter.

The present inventors have conducted extensive studies, and as a result, they have found that desired effects are obtained by incorporating a near-infrared absorbent into a green coloring composition for use in a color filter to control the transmittance of each wavelength region of the formed film. That is, they have found that the problems can be solved by the following configurations.

(1) A green coloring composition for use in a color filter, comprising a green colorant, a near-infrared absorbent, and a polymerizable compound, in which when the coloring composition is used to form a colored film having a film thickness of 0.8 μm, the maximum value of the transmittance at a wavelength from 400 nm to 450 nm of the colored film is 5% or less, the maximum value of the transmittance at a wavelength from 500 nm to 600 nm of the colored film is 70% or more, the minimum value of the transmittance at a wavelength from 650 nm to less than 700 nm of the colored film is 20% or less, and the minimum value of the transmittance at a wavelength from 700 nm to 900 nm of the colored film is 30% or less.

(2) The green coloring composition for use in a color filter as described in (1), in which the maximum value of the transmittance at a wavelength from 400 nm to 450 nm of the colored film is 4% or less.

(3) The green coloring composition for use in a color filter as described in (1) or (2), in which the maximum value of the transmittance at a wavelength from 500 nm to 600 nm of the colored film is 75% or more.

(4) The green coloring composition for use in a color filter as described in any one of (1) to (3), in which the minimum value of the transmittance at a wavelength from 650 nm to less than 700 nm of the colored film is 15% or less.

(5) The green coloring composition for use in a color filter as described in any one of (1) to (4), in which the minimum value of the transmittance at a wavelength from 700 nm to 900 nm of the colored film is 20% or less.

(6) The green coloring composition for use in a color filter as described in any one of (1) to (5), in which the mass ratio of the green colorant to the near-infrared absorbent (the mass of the green colorant/the mass of the near-infrared absorbent) is 0.01 to 10.

(7) The green coloring composition for use in a color filter as described in any one of (1) to (6), in which the near-infrared absorbent includes a pyrrolopyrrole compound or a squarylium compound.

(8) A colored film obtained by curing the green coloring composition for use in a color filter as described in any one of (1) to (7).

(9) A color filter comprising the colored film as described in (8).

(10) A solid-state imaging device comprising the color filter as described in (9).

According to the present invention, it is possible to provide a green coloring composition for use in a color filter, which is capable of forming a green colored film having low incident-angle dependence, and improves the color-separation properties of a solid-state imaging device including the colored film.

In addition, according to the present invention, it is also possible to provide a colored film, a color filter, and a solid-state imaging device, each of which is formed by using the green coloring composition for use in a color filter.

Furthermore, the colored film formed using the green coloring composition for use in a color filter of the present invention has a small transmittance at a wavelength of 700 nm to 900 nm, and thus, can shield a part of so-called infrared light. Usually, a near-infrared ray-cutting filter is provided in a solid-state imaging device to correct visibility.

On the other hand, in the case where the colored film formed using the green coloring composition for use in a color filter of the present invention is applied to a solid-state imaging device, the near-infrared ray-cutting filter may not be used, and thus, it is possible to reduce the size of devices or replace the filter with a more inexpensive near-infrared ray-cutting filter, thereby reducing the production cost. Therefore, according to the present invention, it is possible to obtain four effects of realization of lower magnifications and lower prices of camera modules, and improvement of incident-angle dependence and color-separation properties.

DESCRIPTION OF THE PREFERRED EMBODIMENTS

Figure 1:
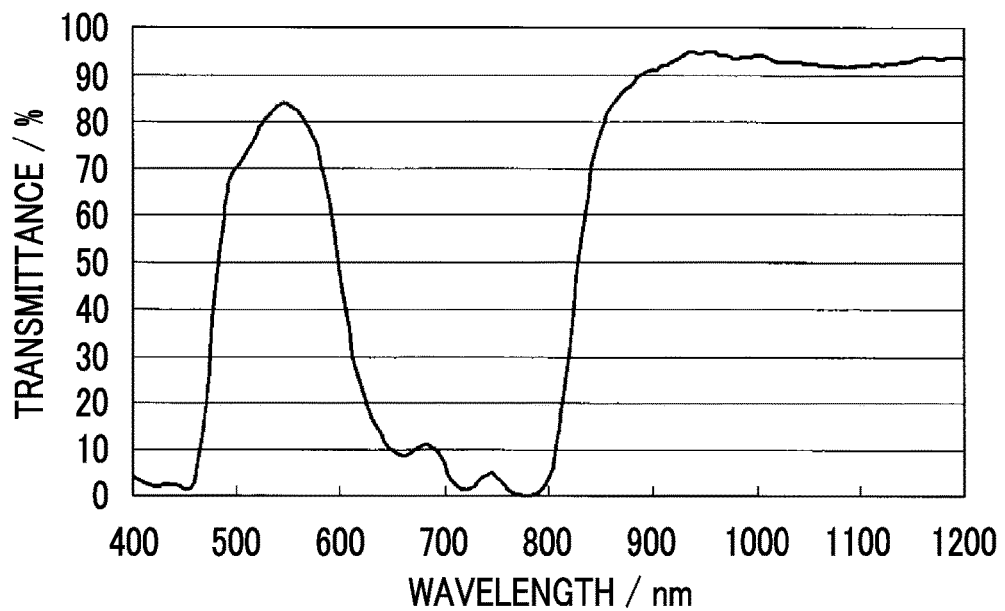
FIG. 1 is a transmission spectrum view of a colored film obtained in Example 1.

Hereinafter, suitable embodiments of the green coloring composition for use in a color filter of the present invention (hereinafter also simply referred to as a "coloring composition" or a "composition") will be described. Further, in the present specification, a range described using "(a value) to (a value)" means a range including the numeral values represented at the start and the end of "(the value) to (the value)" as a lower limit value and an upper limit value, respectively.

By the coloring composition of the present invention, it is possible to shield near-infrared rays by incorporation of a near-infrared absorbent, and to lower the transmittance (particularly the transmittance at a wavelength from 400 nm to 450 nm) of a predetermined wavelength band of a green filter segment formed of the coloring composition. Thus, it is possible to improve the incident-angle dependence of an image sensor and reduce the transmittance in each wavelength region of the colored film, and the color-separation properties with other colored films are improved, which contributes to improvement of image quality. The reason why desired effects are obtained by the above configurations is selection of those which can also reduce the transmittance of a green filter segment by examining the spectroscopy of a near-infrared absorbent for use in shielding near-infrared rays.

Hereinbelow, the range of the transmittance in each wavelength region of a colored film formed of the coloring composition will be first described in detail, and the components included in the coloring composition will be then described in detail.

<Range of Transmittance in Each Wavelength Region of Colored Film (Colored Cured Film)>

The colored film formed using the coloring composition is a green colored film (hereinafter also simply referred to as a "film").

The maximum value of the transmittance at a wavelength of 400 nm or more and 450 nm or less (400 nm to 450 nm) of a film having a film thickness of 0.8 μm, formed using the coloring composition, is 5% or less, and from the viewpoint of improving the characteristics of the green filter segment to enhance the image quality due to color separation of other filter segments in blue, red, or the like (hereinafter also simply referred to as "to improve the effects of the present invention"), the maximum value is preferably 4% or less, and more preferably 3% or less. The lower limit is not particularly limited, and preferably is 0%, but there are many cases where the lower limit is 1% or more.

In the case where the maximum value of the transmittance at a wavelength of 400 nm to 450 nm is more than 5%, the incident-angle dependence is deteriorated.

The maximum value of the transmittance at a wavelength from 500 nm to 600 nm of the film is 70% or more, and in view of superior effects of the present invention, the maximum value is preferably 75% or more, and more preferably 80% or more. The upper limit is not particularly limited, and it is preferably 100%, and in many cases, 95% or less.

In the case where the maximum value of the transmittance at a wavelength from 500 nm to 600 nm is less than 70%, the incident-angle dependence is deteriorated.

The minimum value of the transmittance at a wavelength from 650 nm to less than 700 nm of the film is 20% or less, and in view of superior effects of the present invention, the minimum value is preferably 15% or less, more preferably 11% or less, and still more preferably 9% or less. The lower limit is not particularly limited, and it is preferably 0%.

In the case where the minimum value of the transmittance at a wavelength from 650 nm to less than 700 nm is more than 20%, the incident-angle dependence is deteriorated.

The minimum value of the transmittance at a wavelength from 700 nm to 900 nm of the film is 30% or less, and in view of superior effects of the present invention, the minimum value is preferably 25% or less, and more preferably 20% or less. The lower limit is not particularly limited, and it is preferably 0%.

In the case where the minimum value of the transmittance at a wavelength from 700 nm to 900 nm is more than 30%, the incident-angle dependence is deteriorated.

Each transmittance is measured from the normal direction with respect to the film surface, using U-4100 (manufactured by Hitachi High-Technologies Corp.)

The film thickness of the film formed using the coloring composition is 0.8 μm.

Furthermore, the film thickness is an average film thickness, and is a value obtained by measuring values of the film thickness at arbitrary three or more points of the formed film using a stylus type surface profilometer (DEKTAK150 manufactured by ULVAC Co.) and arithmetically averaging the values, as a method for measuring the average film thickness.

However, the film thickness of 0.8 μm means one inclusive of the range of errors acceptable in the technical field to which the present invention belongs. Specifically, it means a range of a film thickness of 0.8 μm±0.05 μm. In other words, the "film thickness of 0.8 μm" may be any value within a range of 0.75 μm to 0.85 μm.

As for a condition for producing a film using the coloring composition, the coloring composition is applied onto a glass substrate to a predetermined film thickness, dried at 100° C. for 2 minutes, and then irradiated (using an i-line stepper exposure device FPA-3000i5+ (manufactured by Canon Inc.)) with a light at a wavelength of 365 nm at an exposure dose of 1,000 mJ/cm$^2$, and heated at 200° C. for 5 minutes.

Next, the green colorant, the near-infrared absorbent, the polymerizable compound, and other components included in the composition will be described in detail.

<Green Colorant (A)>

The composition includes a green colorant for use in a green filter segment.

The green colorant may be a pigment or a dye, but in terms of light resistance, the pigment is preferable. Further, as the green colorant, one having the maximum peak at a wavelength of 500 nm to 600 nm in the transmission spectrum is preferable.

As the green colorant, green pigments are preferable, and examples thereof include a pigment represented by C. I. Pigment Green in a color index (C. I.; published by The Society of Dyers and Colourists. This shall apply hereinafter).

In addition to the green pigments, yellow pigments known per se may be used in combination. Among the yellow pigments, in view of color reproducibility, C. I. Pigment Yellow 139 is more preferable.

Examples of the green pigment and the yellow pigment which can be preferably used in the present invention include the following pigments. However, the present invention is not limited thereto.

C. I. Pigment Green 7, 10, 36, 37, 58
C. I. Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214

For example, mixtures of C. I. Pigment•Green 7, 36, 37, 58 with C. I. Pigment•Yellow 83, C. I. Pigment•Yellow 138, C. I. Pigment•Yellow 139, C. I. Pigment•Yellow 150, C. I. Pigment•Yellow 180, or C. I. Pigment•Yellow 185 are preferable.

The mass ratio of the green pigments to the yellow pigments is preferably 100:5 to 100:200. When this mass ratio is 100:5 or more, the light transmittance at 400 nm to 450 nm is inhibited, and the color purity can further be enhanced, and when the mass ratio is 100:200 or less, the main wavelength is not toward to the long wavelength side, and thus, the shift from NTSC target color can be inhibited. Among those, the mass ratio is particularly preferably in the range of 100:20 to 100:150.

As the pigment applied to the present invention, a pigment which is as fine as possible is preferable, taking into consideration that a color filter obtained by applying the composition of the present invention has a high color purity. Further, when also taking into consideration the handleability of the composition, the average primary particle diameter of the pigment is preferably 5 nm to 100 nm, and more preferably 5 nm to 50 nm.

The content of the green colorant (for example, a pigment) contained in the composition is preferably 0.1% by mass to 40% by mass, more preferably 1% by mass to 30% by mass, and still more preferably 5% by mass to 20% by mass, with respect to the total solid content of the composition. Further, the solid content means components constituting the film, and does not include an organic solvent (F) which will be described later, and the like.

By adjusting the content of the colorant to the range, when a color filter is manufactured using the composition, appropriate chromaticity is obtained. Further, since curing with radiation sufficiently proceeds and thus, the strength required for a colored film can be maintained, the developing latitude during alkali development can be prevented from being narrowed.

In the case where a pigment is used as a colorant, it is preferable that the pigment is dispersed in advance, together with a pigment dispersant, an organic solvent, a pigment derivative, other components, and the like, if desired, to prepare a pigment dispersion liquid, and the obtained pigment dispersion liquid is mixed with a near-infrared absorbent which will be described later, or other components which will be added, if desired, to prepare a composition.

The pigment dispersion liquid can include a pigment dispersant, a pigment derivative, a polymer material, an organic solvent, and the like, if desired. Hereinafter, the composition of the pigment dispersion liquid, and the method for preparing the pigment dispersion liquid will be described in detail.

The method of preparing the pigment dispersion liquid is not particularly limited, but as for the method for dispersion, for example, the pigment and a pigment dispersant are mixed in advance, dispersed in advance by a homogenizer or the like, and finely dispersed using, for example, a beads dispersing machine (for example, DISPERMAT manufactured by GETZMANN) using zirconia beads or the like.

(Pigment Dispersant)

Examples of the pigment dispersant which can be used in the present invention include a polymer dispersant (for example, a polyamide amine and a salt thereof, a polycarboxylic acid and a salt thereof, a high-molecular-weight unsaturated acid ester, a modified polyurethane, a modified polyester, a modified poly(meth)acrylate, a (meth)acrylic copolymer, and a naphthalene sulfonate formalin condensate), a surfactant such as a polyoxyethylene alkyl phosphoric acid ester, a polyoxyethylene alkylamine, and an alkanolamine; and a pigment derivative.

The polymer dispersants can be further classified into linear polymers, terminal-modified polymers, graft type polymers, and block type polymers, according to the structure.

Examples of the terminal-modified polymers which have a moiety anchored to the pigment surface include a polymer having a phosphoric acid group in the terminal as described in JP1991-112992A (JP-H03-112992A), JP2003-533455A, and the like, a polymer having a sulfonic acid group in the terminal as described in JP2002-273191A, a polymer having a partial skeleton or a heterocycle of an organic dye as described in JP1997-77994A (JP-H09-77994A), and the like. Moreover, a polymer obtained by introducing two or more moieties (acid groups, basic groups, partial skeletons of an organic dye, or heterocycles) anchored to the pigment surface into a polymer terminal as described in JP2007-277514A is also preferable since this polymer is excellent in dispersion stability.

Examples of the graft type polymers having a moiety anchored to the pigment surface include a product of a reaction between a poly(lower alkyleneimine) and a polyester, which is described in JP1979-37082A (JP-S54-37082A), JP1996-507960A (JP-H08-507960A), JP2009-258668A, and the like, a product of a reaction between a polyallylamine and a polyester, which is described in JP1997-169821A (JP-H09-169821A) and the like, a copolymer of a macromonomer and a nitrogen atom monomer, which is described in JP1998-339949A (JP-H10-339949A), JP2004-37986A, and the like, a graft polymer having a partial skeleton or a heterocycle of an organic dye, which is described in JP2003-238837A, JP2008-9426A, JP2008-81732A, and the like, and a copolymer of a macromonomer and an acid group-containing monomer, which is described in JP2010-106268A, and the like. In particular, from the viewpoint of dispersibility and dispersion stability of a pigment dispersion, an amphoteric dispersion resin having basic and acid groups, described in JP2009-203462A, is particularly preferable.

As the macromonomer used in producing a graft type polymer having a moiety anchored to the pigment surface by radical polymerization, known macromonomers can be used, and examples thereof include macromonomers AA-6 (polymethyl methacrylate having a methacryloyl group as a terminal group), AS-6 (polystyrene having a methacryloyl group as a terminal group), AN-6S (a copolymer of styrene and acrylonitrile that has a methacryloyl group as a terminal group), and AB-6 (polybutyl acrylate having a methacryloyl group as a terminal group) manufactured by TOAGOSEI, CO., LTD.; Placcel FM 5 (a product obtained by adding 5 molar equivalents of s-caprolactone to 2-hydroxyethyl methacrylate) and FA10L (a product obtained by adding 10 molar equivalents of s-caprolactone to 2-hydroxyethyl acrylate) manufactured by DAICEL CORPORATION; a polyester-based macromonomer described in JP1990-272009A (JP-H02-272009A), and the like. Among these, from the viewpoints of dispersibility and dispersion stability of the pigment dispersion, the polyester-based macromonomer excellent in flexibility and solvent compatibility is particularly preferable. Furthermore, the polyester-based macromonomer represented by the polyester-based macromonomer described in JP1990-272009A (JP-H02-272009A) is most preferable.

As the block type polymer having a moiety anchored to the pigment surface, the block type polymers described in JP2003-49110A, JP2009-52010A, and the like are preferable.

The pigment dispersant which can be in the present invention can be obtained in the form of commercially available products, and specific examples thereof include "Disperbyk-101 (polyamidoamine phosphoric acid salt), 107 (carboxylic acid ester), 110 (copolymer including an acid group), 130 (polyamide), 161, 162, 163, 164, 165, 166, 170 (polymeric copolymer)" and "BYK-P104, P105 (high-molecular-weight unsaturated polycarboxylic acid) manufactured by BYK Additives & Instruments, "EFKA 4047, 4050 to 4010 to 4165 (polyurethane-based), EFKA 4330 to 4340 (block copolymer), 4400 to 4402 (modified polyacrylate), 5010 (polyesteramide), 5765 (high-molecular-weight polycarboxylic acid salt), 6220 (aliphatic polyester), 6745 (phthalocyanine derivative), 6750 (azo pigment derivative)" manufactured by EFKA, "Ajisper PB821, PB822, PB880, PB881" manufactured by Ajinomoto Fine-Techno Co., Inc., "Flowlen TG-710 (urethane oligomer)" and "Polyflow No. 50E, No. 300 (acrylic copolymer) manufactured by KYOE-ISHA CHEMICAL Co., LTD., "Disparlon KS-860, 873SN, 874, #2150 (aliphatic polyvalent carboxylic acid), #7004 (polyether ester), DA-703-50, DA-705, and DA-725" manufactured by Kusumoto Chemicals, Ltd., "Demol RN, N (naphthalene sulfonate formaldehyde condensate), MS, C, SN-B (aromatic sulfonate formaldehyde condensate)", "Homogenol L-18 (polymeric polycarboxylic acid), "Emulgen 920, 930, 935, 985 (polyoxyethylene nonyl phenyl ether)", and "Acetamine (stearylamine acetate)" manufactured by Kao Corporation, "Solsperse 5000 (phthalocyanine derivative), 22000 (azo pigment derivative), 13240 (polyesteramine), 3000, 17000, 27000 (polymer having a functional portion in the terminal portion), 24000, 28000, 32000, 38500 (graft polymer)" manufactured by The Lubrizol Corporation, Japan, "Nikkol T106 (polyoxyethylene sorbitan monooleate) and MYS-IEX (polyoxyethylene monostearate)" manufactured by NIKKO CHEMICAL CO., LTD., "Hinoact T-8000E" and the like manufactured by Kawaken Fine Chemicals Co., Ltd., "organosiloxane polymer KP341" manufactured by Shin-Etsu Chemical Co., Ltd., a cationic surfactant such as "W001" manufactured by Yusho Co., Ltd. and nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and sorbitan aliphatic acid ester, and anionic surfactants such as "W004, W005, and W017", "EFKA-46, EFKA-47, EFKA-47EA, EFKA polymer 100, EFKA polymer 400, EFKA polymer 401, and EFKA polymer 450" manufactured by MORISHITA KAGAKU SANGYO CORPORATION, polymer dispersants such as "Disperse aid 6, Disperse aid 8, Disperse aid 15, and Disperse aid 9100" manufactured by SAN NOPCO LIMITED, "Adeka Pluronic L31, F38, L42, L44, L61, L64, F68, L72, P95, F77, P84, F87, P94, L101, P103, F108, L121, and P-123" manufactured by ADEKA CORPORATION, "IONET S-20" manufactured by Sanyo Chemical Industries, Ltd., and the like.

The pigment dispersants may be used alone or in combination of two or more kinds thereof. According to the present invention, it is particularly preferable to use a polymer dispersant. Further, as to the pigment dispersant, the terminal-modified polymer, the graft type polymer, or the block type polymer, which has an anchor moiety to the pigment surface, may be also used in combination with an alkali-soluble resin which will be described hereinafter.

The content of the pigment dispersant in the pigment dispersion liquid is preferably 1 part by mass to 80 parts by mass, more preferably 5 parts by mass to 70 parts by mass, and still more preferably 10 parts by mass to 60 parts by mass, with respect to 100 parts by mass of the pigment.

Specifically, in the case of using the polymer dispersant, the amount thereof to be used is preferably 5 parts by mass to 100 parts by mass, and more preferably 10 parts by mass to 80 parts by mass, with respect to 100 parts by mass of the pigment (Pigment Derivative)

It is preferable that the pigment dispersion liquid further contains a pigment derivative.

The pigment derivative is a compound having a structure wherein a part of an organic pigment is substituted with an acidic group, a basic group, or a phthalimidomethyl group. As to the pigment derivative, it is preferable to include a pigment derivative having an acidic group or a basic group from the viewpoint of dispersibility and dispersion stability.

As the organic pigment for constituting the pigment derivative, for example, a diketopyrrolopyrrol-based pigment, an azo-based pigment, a phthalocyanine-based pigment, an anthraquinone-based pigment, a quinacridone-based pigment, a dioxazine-based pigment, a perinone-based pigment, a perylene-based pigment, a thioindigo-based pigment, an isoindoline-based pigment, an isoindolinone-based pigment, a quinophthalone-based pigment, a threne-based pigment, and a metal complex-based pigment are exemplified.

Furthermore, as the acidic group which the pigment derivative has, a sulfonic acid, a carboxylic acid, and a quaternary ammonium salt thereof are preferable, a carboxylic acid group and a sulfonic acid group are more preferable, and a sulfonic acid group is particularly preferable. As the basic group which the pigment derivative has, an amino group is preferable and a tertiary amino group is particularly preferable.

As the pigment derivative, in particular, a quinoline-based pigment derivative, a benzimidazolone-based pigment derivative and an isoindoline-based pigment derivative are preferable, and a quinoline-based pigment derivative and a benzimidazolone-based pigment derivative are more preferable.

The content of the pigment derivative in the pigment dispersion liquid is preferably 1% by mass to 50% by mass, and more preferably 3% by mass to 30% by mass, with respect to the total mass of the pigment. The pigment derivative may be used alone or in combination of two or more kinds thereof.

Furthermore, in the case of using the pigment derivative in combination, the amount of the pigment derivative to be used is preferably in a range of 1 part to 30 parts, more preferably in a range of 3 parts to 20 parts, and particularly preferably in a range of 5 parts to 15 parts, in terms of mass, with respect to 100 parts by mass of the pigment.

(Organic Solvent)

It is preferable that the pigment dispersion liquid contains an organic solvent. The organic solvent is selected according to the solubility of each component contained in the pigment dispersion liquid, a coating property in the case of applying the pigment dispersion liquid to the composition, and the like. Examples of the organic solvent which can be used in the pigment dispersion liquid include those which will be described later as an organic solvent (F).

The content of the organic solvent in the pigment dispersion liquid is preferably 50% by mass to 95% by mass, and more preferably 70% by mass to 90% by mass.

(Polymer Materials)

The pigment dispersion liquid may further contain a binder including a compound represented by General Formula (X) which will be described later as a copolymerization component and/or polymer materials having other structures, in addition to the respective components described above, from the viewpoint of improvement in the dispersion stability, control of the developability in the case of applying the pigment dispersion liquid to the composition, and the like.

The binder including a compound represented by General Formula (X) as a copolymerization component will be described later. Examples of the polymer materials having other structures include a polyamidoamine or a salt thereof, a polycarboxylic acid or a salt thereof, a high-molecular-weight unsaturated acid ester, a modified polyurethane, a modified polyester, a modified poly(meth)acrylate, a (meth)acrylic copolymer (particularly preferably a (meth)acrylic acid copolymer containing a carboxylic acid group and a polymerizable group in its side chain), and a naphthalene sulfonic acid-formalin condensate. Such a polymer material is adsorbed on a surface of the pigment to act so as to prevent reaggregation and thus, a terminal-modified polymer, a graft type polymer, and a block type polymer each having an anchor moiety to a pigment surface are preferable, and examples thereof include a graft type copolymer including a monomer containing a heterocyclic ring and a polymerizable oligomer having an ethylenically unsaturated bond as the copolymer units.

Other examples of the polymer material include a polyamidoamine phosphate, a high-molecular-weight unsaturated polycarboxylic acid, a polyetherester, an aromatic sulfonic acid-formalin polycondensate, polyoxyethylene nonylphenyl ether, a polyesteramine, polyoxyethylene sorbitan monooleate, and polyoxyethylene monostearate.

These polymer materials having other structures may be used alone or in combination of two or more kinds thereof.

The content of the polymer material in the pigment dispersion liquid is preferably 20% by mass to 80% by mass, more preferably 30% by mass to 70% by mass, and still more preferably 40% by mass to 60% by mass, with respect to the total mass of the pigment.

<Near-Infrared Absorbent (B)>

The composition contains a near-infrared absorbent. The kind of the near-infrared absorbent is not particularly limited, and as described above, the near-infrared absorbent is appropriately selected such that the formed film exhibits a predetermined transmittance.

Among these, as the near-infrared absorbent, a cyanine compound, a pyrrolopyrrole compound, or a squarylium compound is more preferably contained, with the pyrrolopyrrole compound or a squarylium compound being still more preferable. Further, the near-infrared absorbents may be used alone or in combination of two or more kinds thereof.

The pyrrolopyrrole compound has a maximum absorption wavelength (when being formed into a film), preferably in the range of 650 nm to 900 nm, more preferably in the range of 700 nm to 900 nm, and particularly preferably in the range of 750 nm to 900 nm.

As the pyrrolopyrrole compound, a compound represented by the following General Formula (A1) is preferable.

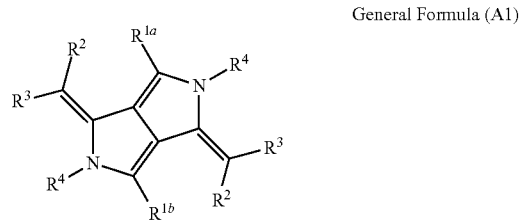

General Formula (A1)

(In General Formula (A1), $R^{1a}$ and $R^{1b}$ each independently represent an alkyl group, an aryl group, or a heteroaryl group. $R^2$ and $R^3$ each independently represent a hydrogen atom or a substituent, at least one of $R^2$ or $R^3$ is an electron withdrawing group, and $R^2$ and $R^3$ may be bonded to each other to form a ring. $R^4$ represents a hydrogen atom, an alkyl group, an aryl group, a heteroaryl group, or a substituted ring boron or metal atom, and may form a covalent bond or coordinate bond with at least one of $R^{1a}$, $R^{1b}$, or $R^3$.)

In General Formula (A1), the alkyl group represented by $R^{1a}$ or $R^{1b}$ is preferably an alkyl group having 1 to 30 carbon atoms, more preferably an alkyl group having 1 to 20 carbon atoms, and particularly preferably an alkyl group having 1 to 10 carbon atoms.

The aryl group represented by $R^{1a}$ or $R^{1b}$ is preferably an aryl group having 6 to 30 carbon atoms, more preferably an aryl group having 6 to 20 carbon atoms, and particularly preferably an aryl group having 6 to 12 carbon atoms.

The heteroaryl group represented by $R^{1a}$ or $R^{1b}$ is preferably a heteroaryl group having 1 to 30 carbon atoms, and more preferably a heteroaryl group having 1 to 12 carbon atoms. Examples of the hetero atoms include a nitrogen atom, an oxygen atom, and a sulfur atom.

Furthermore, the group represented by $R^{1a}$ or $R^{1b}$ may further have a substituent. Further, examples of the substituent include a substituent T which will be described later.

In particular, the group represented by $R^{1a}$ or $R^{1b}$ is preferably an aryl group having an alkoxy group having a linear or branched alkyl group, or an aryl group having an alkyl group. As the alkyl group in the branched alkyl group, an alkyl group having 3 to 30 carbon atoms is preferable, and an alkyl group having 3 to 20 carbon atoms is more preferable. As the linear alkyl group, an linear alkyl group having 1 to 20 carbon atoms is preferable, and an linear alkyl group having 1 to 10 carbon atoms is more preferable.

The group represented by $R^{1a}$ or $R^{1b}$ is particularly preferably, for example, 4-(2-ethylhexyloxy)phenyl, 4-(2-methylbutyloxy)phenyl, 4-(2-octyldodecyloxy)phenyl, 2-methylphenyl, or 4-(nonadecacyloxy)phenyl.

$R^{1a}$ and $R^{1b}$ in General Formula (A1) may be the same as or different from each other.

$R^2$ and $R^3$ each independently represent a hydrogen atom or a substituent T, and at least one of $R^2$ or $R^3$ represents an electron withdrawing group, or $R^2$ and $R^3$ may be bonded to each other to form a ring. Particularly, it is preferable that $R^2$ and $R^3$ each independently represent a cyano group or a heterocyclic group.

Examples of the substituent T include an alkyl group (preferably having 1 to 30 carbon atoms), an alkenyl group (preferably having 2 to 30 carbon atoms), an alkynyl group (preferably having 2 to 30 carbon atoms), an aryl group (preferably having 6 to 30 carbon atoms), an amino group (preferably having 0 to 30 carbon atoms), an alkoxy group (preferably having 1 to 30 carbon atoms), an aryloxy group (preferably having 6 to 30 carbon atoms), an aromatic heterocyclic oxy group (preferably having 1 to 30 carbon atoms), acyl group (preferably having 1 to 30 carbon atoms), an alkoxycarbonyl group (preferably having 2 to 30 carbon atoms), an aryloxycarbonyl group (preferably having 7 to 30 carbon atoms), an acyloxy group (preferably having 2 to 30 carbon atoms), an acylamino group (preferably having 2 to 30 carbon atoms), an alkoxycarbonylamino group (preferably having 2 to 30 carbon atoms), an aryloxycarbonylamino group (preferably having 7 to 30 carbon atoms), a sulfonylamino group (preferably having 1 to 30 carbon atoms), a sulfamoyl group (preferably having 0 to 30 carbon atoms), a carbamoyl group (preferably having 1 to 30 carbon atoms), an alkylthio group (preferably having 1 to 30 carbon atoms), an arylthio group (preferably having 6 to 30 carbon atoms), an aromatic heterocyclic thio group (preferably having 1 to 30 carbon atoms), a sulfonyl group (preferably having 1 to 30 carbon atoms), a sulfinyl group (preferably having 1 to 30 carbon atoms), a ureido group (preferably having 1 to 30 carbon atoms), a phosphoric acid amide group (preferably having 1 to 30 carbon atoms), a hydroxyl group, a mercapto group, a halogen atom, a cyano group, a sulfo group, a carboxyl group, a nitro group, a hydroxamic acid group, a sulfino group, a hydrazino group, an imino group, and a heterocyclic group (preferably having 1 to 30 carbon atoms).

At least one of $R^2$ and $R^3$ is an electron withdrawing group.

In the present invention, examples of the electron withdrawing group include substituents having a Hammett substituent constant σp value of 0.2 or more. The σp value is preferably 0.25 or more, more preferably 0.3 or more, and particularly preferably 0.35 or more. The upper limit is not particularly limited, but is preferably 0.80.

Specific examples of the electron withdrawing group include cyano group (0.66), a carboxyl group (—COOH: 0.45), an alkoxycarbonyl group (—COOMe: 0.45), an aryloxycarbonyl group (—COOPh: 0.44), a carbamoyl group (—CONH$_2$: 0.36), an alkylcarbonyl group (—COMe: 0.50), an arylcarbonyl group (—COPh: 0.43), an alkylsulfonyl group (—SO$_2$Me: 0.72), and an arylsulfonyl group (—SO$_2$Ph: 0.68), with the cyano group being particularly preferable. Here, Me represents a methyl group and Ph represents a phenyl group.

As for the Hammett substituent constant σ value, reference can be made to, for example, paragraphs "0017" to "0018" of JP2011-68731A, the contents of which are incorporated herein by reference.

Incidentally, in the case where $R^2$ and $R^3$ are bonded to each other to form a ring, they preferably form a 5- to 7-membered ring (preferably a 5- or 6-membered ring). Typically, the ring thus formed is preferably one of those used as acidic nuclei in merocyanine dyes, and as for the specific examples, reference can be made to, for example, paragraphs "0019" to "0021" of JP2011-68731A, the contents of which are incorporated herein by reference.

$R^3$ is particularly preferably a heterocyclic group. In particular, $R^3$ is preferably a quinoline group, a benzothiazole group, or a naphthothiazole group.

In General Formula (A1), two $R^3$'s may be the same as or different from each other.

When the group represented by $R^4$ is an alkyl group, an aryl group, or a heteroaryl group, this group has the same definition as $R^{1a}$ and $R^{1b}$, and the preferable groups are also the same.

When the group represented by $R^4$ is a substituted boron atom, the substituent has the same definition as the substituent T mentioned for $R^2$ and $R^3$, and preferably an alkyl group, an aryl group, or a heteroaryl group.

Furthermore, when the group represented by $R^4$ is a metal atom, it is preferably a transition metal. Preferred examples of the substituted boron include difluoroboron, diphenylboron, dibutylboron, dinaphthylboron, and catecholboron. Among them, diphenylboron is particularly preferable.

$R^4$ may form a covalent bond or coordinate bond with at least one of $R^{1a}$, $R^{1b}$, or $R^3$, and $R^4$ particularly preferably forms a coordinate bond with $R^3$.

In particular, as $R^4$, a hydrogen atom or a substituted boron (particularly diphenylboron) is preferable.

Two $R^4$'s in General Formula (A1) may be the same as or different from each other.

As for the compound represented by General Formula (A1), reference can be made to, for example, paragraphs "0024" to "0052" of JP2011-68731A (or "0043" to "0074" of the corresponding US2011/0070407A), the contents of which are incorporated herein by reference.

As the pyrrolopyrrole compound, a compound represented by the following General Formula (A2) is more preferable, and a compound represented by the following General Formula (A3) is still more preferable.

General Formula (A2)

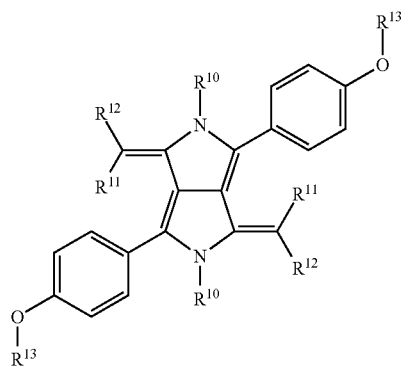

(In General Formula (A2), $R^{10}$'s each independently represent a hydrogen atom, an alkyl group, an aryl group, a heteroaryl group, a substituted boron, or a metal atom, or may form a covalent bond or a coordinate bond with $R^{12}$. $R^{11}$ and $R^{12}$ each independently represent a hydrogen atom or a substituent, and at least one of $R^{11}$ or $R^{12}$ is an electron withdrawing group, or $R^{11}$ and $R^{12}$ may be bonded to with each other to form a ring. $R^{13}$'s each independently represent a linear or branched alkyl group having from 3 to 30 carbon atoms.)

Furthermore, $R^{13}$ is preferably a branched alkyl group.

$R^{10}$ has the same definitions as $R^4$ in General Formula (A1) and preferable ranges are also the same.

$R^{11}$ and $R^{12}$ have the same definitions as $R^2$ and $R^3$ in General Formula (A1) and preferable ranges are also the same.

$R^{13}$ may be the same as or different from each other.

Moreover, $R^{13}$ is preferably an alcohol residue derived, for example, from isoeicosanol (FINEOXOCOL 2000 manufactured by Nissan Chemical Industries, Ltd.).

The alcohol residue ($R^{13}O$—) represents a group formed by removing a hydrogen atom from a hydroxy group of an alcohol ($R^{13}OH$), and the alcohol ($R^{13}OH$) may be linear or branched, and is preferably an alcohol having 1 to 30 carbon atoms, more preferably an alcohol having 3 to 25 carbon atoms, and particularly preferably a linear or branched alcohol having 3 to 25 carbon atoms. More specific examples thereof include methanol, ethanol, isopropanol, n-butanol, tert-butanol, 1-octanol, 1-decanol, 1-hexadecanol, 2-methylbutanol, 2-ethylhexanol, 2-octyldodecanol, isohexadecanol (FINEOXOCOL 1600 manufactured by Nissan Chemical Industries, Ltd.), isooctadecanol (FINEOXOCOL 180 manufactured by Nissan Chemical Industries, Ltd.), isooctadecanol (FINEOXOCOL 180N manufactured by Nissan Chemical Industries, Ltd.), isooctadecanol (FINEOXOCOL 180T manufactured by Nissan Chemical Industries, Ltd.), isoeicosanol (FINEOXOCOL 2000 produced by Nissan Chemical Industries, Ltd.), and 1-eicosanol.

General Formula (A3)

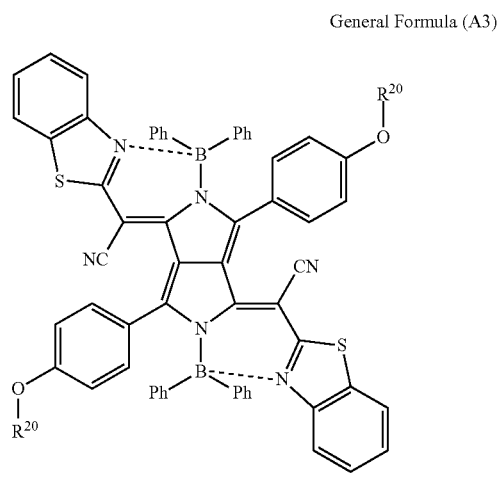

(In General Formula (A3), $R^{20}$'s each independently represent a linear or branched alkyl group having 3 to 30 carbon atoms.)

In General Formula (A3), $R^{20}$ has the same meanings as $R^{13}$ in General Formula (A2) above, and preferable ranges are also the same.

The squarylium compound is preferably a compound represented by the following General Formula (1).

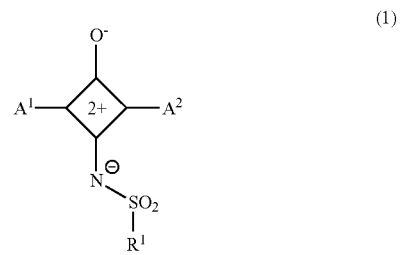

In General Formula (1), $A^1$ and $A^2$ each independently represent an aryl group, a heterocyclic group or a group represented by the following General Formula (2), and $R^1$ represents an alkyl group having one or more halogen atoms, an aryl group having one or more halogen atoms, or a heterocyclic group having one or more halogen atoms.

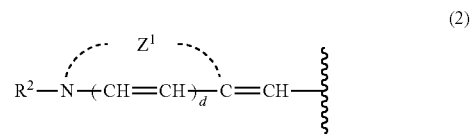

In General Formula (2), $Z^1$ represents a non-metal atomic group that forms a nitrogen-containing heterocycle, $R^2$ represents an alkyl group, an alkenyl group, or an aralkyl group, d represents 0 or 1, and the dotted line represents a bonding hand with General Formula (1).

$R^1$ in General Formula (1) is preferably an alkyl group having one or more halogen atoms, an aryl group having one or more halogen atoms, or a heterocyclic group having one or more halogen atoms, more preferably an alkyl group having one or more halogen atoms, or an aryl group having one or more halogen atoms, and particularly preferably an alkyl group having one or more halogen atoms.

Examples of the halogen atom include a fluorine atom, a chlorine atom, a bromine atom, and an iodine atom, preferably a fluorine atom or a chlorine atom, and more preferably a fluorine atom.

The number of halogen atoms contained in $R^1$ is 1 or more, it is preferable that 50% or more of the hydrogen atoms bonded to a carbon atom of a group represented by $R^1$ (an alkyl group, an aryl group, or a heterocyclic group) are substituted with halogen atoms, it is more preferable that 80% or more of the hydrogen atoms are substituted with halogen atoms, and it is particularly preferable that 100% of the hydrogen atoms are substituted with halogen atoms.

The number of carbon atoms of the alkyl group is preferably 1 to 20, more preferably 1 to 15, still more preferably 1 to 8, and particularly preferably 1 to 3. The alkyl group may be linear, branched, or cyclic, and preferably linear or branched.

The number of carbon atoms of the aryl group is preferably 6 to 48, more preferably 6 to 24, and still more preferably 6.

The heterocyclic group is preferably a 5- or 6-membered ring. Further, the heterocyclic group is preferably a monocycle or a condensed ring, more preferably a monocycle or a condensed ring having 2 to 8 rings, and still more preferably a monocycle or a condensed ring having 2 to 4 rings. Examples of the hetero atom included in the heterocyclic group include a nitrogen atom, an oxygen atom, and a sulfur atom. The number of the hetero atom is preferably 1 to 3, and more preferably 1 to 2.

$R^1$ is preferably a perfluoroalkyl group or a perfluoroaryl group, and particularly preferably a perfluoroalkyl group. Further, the perfluoroalkyl group means the group in which all the hydrogen atoms bonded to carbon atoms constituting an alkyl group are substituted with fluorine atoms. Further, the perfluoroaryl group means the group in which all the hydrogen atoms bonded to carbon atoms constituting an aryl group are substituted with fluorine atoms.

$A^1$ and $A^2$ in General Formula (1) each independently represent an aryl group, a heterocyclic group, or a group represented by General Formula (2), with the group represented by General Formula (2) being preferable.

The number of carbon atoms of the aryl group represented by $A^1$ and $A^2$ is preferably 6 to 48, more preferably 6 to 24, and particularly preferably 6 to 12. Specific examples thereof include a, phenyl group and a naphthyl group. Further, the number of carbon atoms of the aryl group in the case where the aryl group has a substituent means the number exclusive of the number of carbon atoms of the substituent.

The heterocyclic group represented by $A^1$ and $A^2$ is preferably a 5- or 6-membered ring. Further, the heterocyclic group is preferably a monocyclic or a condensed ring, and also is preferably a monocycle or a condensed ring having 2 to 8 rings, more preferably a monocycle or a condensed ring having 2 to 4 rings, and still more preferably a monocycle or a condensed ring having 2 or 3 rings. Examples of the hetero atom included in the heterocyclic group include a nitrogen atom, an oxygen atom, and a sulfur atom, with the nitrogen atom and the sulfur atom being preferable. The number of hetero atoms is preferably 1 to 3, and more preferably 1 or 2. Particularly, examples of the heterocyclic group include heterocyclic groups derived from a monocyclic or polycyclic aromatic ring of a 5-membered ring, a 6-membered ring, and the like, containing at least one of a nitrogen atom, an oxygen atom, or a sulfur atom.

The aryl group and the heterocyclic group may have a substituent.

The substituent which the aryl group and the heterocyclic group may have is preferably a halogen atom, an alkyl group, a hydroxy group, an amino group, or an acylamino group.

The halogen atom is preferably a chlorine atom.

The number of carbon atoms of the alkyl group is preferably 1 to 20, more preferably 1 to 10, still more preferably 1 to 5, and most preferably 1 to 4. The alkyl group is preferably linear or branched.

The amino group is preferably a group represented by —$NR^{100}R^{101}$. $R^{100}$ and $R^{101}$ each independently represent a hydrogen atom or an alkyl group having 1 to 30 carbon atoms. The number of carbon atoms of the alkyl group is preferably 1 to 30, more preferably 1 to 20, still more preferably 1 to 10, and particularly preferably 1 to 8. The alkyl group is preferably linear or branched, and more preferably linear.

The acylamino group is preferably a group represented by —$NR^{102}$—C(=O)—$R^{103}$. $R^{102}$ represents a hydrogen atom or an alkyl group, and preferably a hydrogen atom. $R^{103}$ represents and alkyl group. The number of carbon atoms of the alkyl group represented by $R^{102}$ and $R^{103}$ is preferably 1 to 20, more preferably 1 to 10, still more preferably 1 to 5, and particularly preferably 1 to 4.

In the case where the aryl group and the heterocyclic group have two or more substituents, the plural substituents may be the same as or different from each other.

Next, the group represented by General Formula (2), which is represented by $A^1$ and $A^2$, will be described.

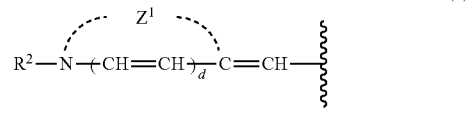

(2)

In General Formula (2), $Z^1$ a non-metal atomic group that forms a nitrogen-containing heterocycle, $R^2$ represents an alkyl group, an alkenyl group, or an aralkyl group, d represents 0 or 1, the dotted line represents a bonding hand to General Formula (1).

In General Formula (2), $R^2$ represents an alkyl group, an alkenyl group, or an aralkyl group, and preferably an alkyl group. The number of carbon atoms of the alkyl group is preferably 1 to 30, more preferably 1 to 20, still more preferably 1 to 12, and particularly preferably 2 to 8. The number of carbon atoms of the alkenyl group is preferably 2 to 30, more preferably 2 to 20, and still more preferably 2 to 12. The alkyl group and the alkenyl group may be linear, branched, or cyclic, and preferably linear or branched. The number of carbon atoms of the aralkyl group is preferably 7 to 30, and more preferably 7 to 20.

In General Formula (2), the nitrogen-containing heterocycle formed of $Z^1$ is preferably a 5- or 6-membered ring. Further, the nitrogen-containing heterocycle is preferably a monocyclic or a condensed ring, preferably a monocycle or a condensed ring having 2 to 8 rings, more preferably a monocycle or a condensed ring having 2 to 4 rings, and still more preferably a condensed ring having 2 or 3 rings. The nitrogen-containing heterocycle may include a sulfur atom, in addition to a nitrogen atom. Further, the nitrogen-containing heterocycle may have a substituent. As the substituent, for example, a halogen atom, an alkyl group, a hydroxy group, an amino group, and an acylamino group are preferable, and a halogen atom and an alkyl group are more preferable. The halogen atom is preferably a chlorine atom. The number of carbon atoms of the alkyl group is preferably 1 to 30, more preferably 1 to 20, and still more preferably 1 to 12. The alkyl group is preferably linear or branched.

The group represented by General Formula (2) is preferably a group represented by the following General Formula (3) or (4).

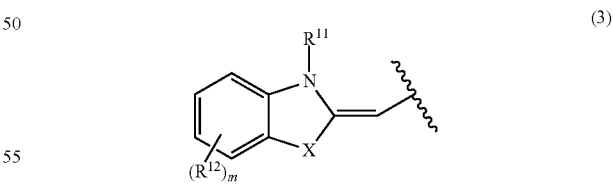

(3)

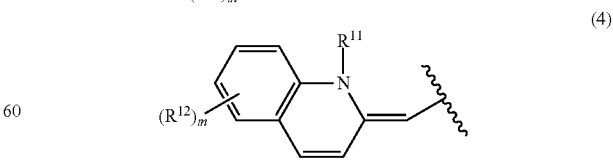

(4)

In General Formulae (3) and (4), $R^{11}$ represents an alkyl group, an alkenyl group, or an aralkyl group, $R^{12}$ represents a substituent, and in the case where m is 2 or more, $R^{12}$'s may be linked to each other to form a ring, X represents a sulfur atom or $CR^{13}R^{14}$, $R^{13}$ and $R^{14}$ each independently represent a hydrogen atom or a substituent, m represents an integer of 0 to 4, and the dotted line represents a bonding hand to General Formula (1).

$R^{11}$ in General Formulae (3) and (4) has the same definition as $R^2$ in General Formula (2), and preferable ranges thereof are also the same.

$R^{12}$ in General Formulae (3) and (4) represents a substituent. As the substituent, for example, a halogen atom, an alkyl group, a hydroxy group, an amino group, and an acylamino group are preferable, and a halogen atom and an alkyl group are more preferable. The halogen atom is preferably a chlorine atom. The number of carbon atoms of the alkyl group is preferably 1 to 30, more preferably 1 to 20, and still more preferably 1 to 12. The alkyl group is preferably linear or branched.

In the case where m is 2 or more, $R^{12}$'s may be bonded to each other to form a ring. Examples of the ring include an alicyclic ring (non-aromatic hydrocarbon ring), an aromatic ring, and a heterocycle. The ring may be monocyclic or polycyclic. The linking group in the case where substituents may be linked to each other to form a ring can be linked to a divalent linking group selected from the group consisting of —CO—, —O—, —NH—, divalent aliphatic group, divalent aromatic group, and a combination thereof. For example, it is preferable that $R^{12}$'s are linked to each other to form a benzene ring.

X in General Formula (3) represents a sulfur atom of $CR^{13}R^{14}$, and $R^{13}$ and $R^{14}$ each independently represent a hydrogen atom or a substituent. Examples of the substituent include an alkyl group. The number of carbon atoms of the alkyl group is preferably 1 to 20, more preferably 1 to 10, still more preferably 1 to 5, particularly preferably 1 to 3, and most particularly 1. The alkyl group is preferably linear or branched, and particularly preferably linear.

m represents an integer of 0 to 4, and is preferably 0 to 2.

The molecular weight of the compound represented by General Formula (1) is preferably 100 to 2,000, and more preferably 150 to 1,000.

The compound represented by General Formula (1) preferably has a maximum absorption wavelength at a wavelength of 600 nm to 800 nm, more preferably a maximum absorption wavelength at 600 nm to 750 nm, and still more preferably a maximum absorption wavelength at 650 nm to 750 nm.

Specific examples of the compound represented by General Formula (1) include the compounds described below, but are not limited thereto. Further, in the following description, $R^1$, $A^1$, and $A^2$ each correspond to General Formula (1). In addition, the dotted line in the groups represented by $A^1$ and $A^2$ represents a bonding hand to General Formula (1).

TABLE 1

| No. | $R^1$ | $A^1$ | $A^2$ |
|---|---|---|---|
| I-1 | $CF_3$ | 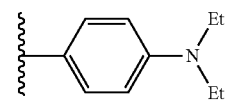 [SMILES: *c1ccc(N(CC)CC)cc1] | 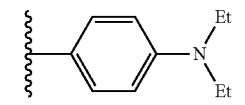 |
| I-3 | $CF_3$ | 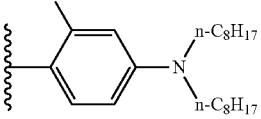 | 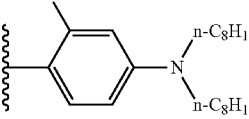 |
| I-5 | $C_6F_5$ | 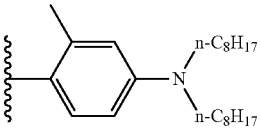 | 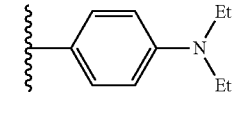 |
| I-6 | $C_2F_5$ | 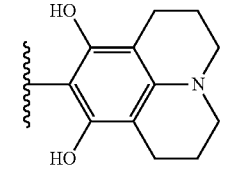 [SMILES: *c1c(O)c2c3c(c1O)CCCN3CCC2] | 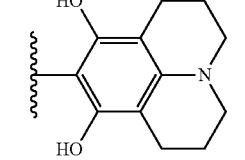 |
| I-7 | $C_3F_7$ | 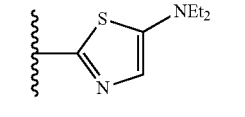 | 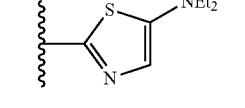 |
| I-9 | $CF_3$ | 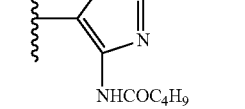 | 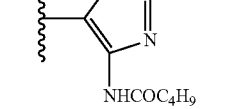 |

TABLE 2

| No. | R¹ | A¹ | A² |
|---|---|---|---|
| I-17 | $CF_3$ | benzothiazole with N-$C_2H_5$ | benzothiazole with N-$C_2H_5$ |
| I-20 | $CF_3$ | naphthalene with n-$C_8H_{17}$, n-$C_8H_{17}$-NH and HN substituents | naphthalene with n-$C_8H_{17}$, n-$C_8H_{17}$-NH and HN substituents |
| I-21 | $CF_3$ | chloro-benzothiazole with N-$C_2H_5$ | chloro-benzothiazole with N-$C_2H_5$ |
| I-22 | $CF_3$ | benz[e]indoline with N-$C_2H_5$ | benz[e]indoline with N-$C_2H_5$ |

The content of the near-infrared absorbent contained in composition is not particularly limited, but in view of superior effects of the present invention, it is preferably 1% by mass to 75% by mass, more preferably 3% by mass to 70% by mass, and still more preferably 10% by mass to 65% by mass, with respect to the total solid content of the composition.

The mass ratio of the green colorant to the near-infrared absorbent (the mass of the green colorant/the mass of the near-infrared absorbent) in the composition is not particularly limited, but in view of superior effects of the present invention, it is preferably 0.01 to 10, more preferably 0.01 to 5, still more preferably 0.01 to 3, particularly preferably 0.1 to 1, and particularly preferably 0.1 to 0.4. By adjusting the mass ratio to this range, near-infrared absorption properties are further improved, and the incident-angle dependence is decreased, thereby leading to improvement of image quality.

Furthermore, in the case where two or more kinds of colorant are used as the colorant (for example, the case where a green pigment and a yellow pigment are used), the mass of the green colorant alone (green pigment) corresponds to the "mass of the green colorant".

<Polymerizable Compound (C)>

The composition of the present invention contains a polymerizable compound.

Particularly, the polymerizable compound is preferably selected from compounds having at least one and preferably two or more terminal ethylenically unsaturated bonds. Among these, polyfunctional polymerizable compounds having 4 or more functional groups are preferable, and polyfunctional polymerizable compounds having 5 or more functional groups are more preferable.

Such compound groups are widely known in the industrial field of the relevant art and can be used in the present invention without particular limitation. These may be in any type of chemical forms such as, for example, a monomer, a prepolymer (that is, a dimer, a trimer, and an oligomer), a mixture thereof, and a multimer thereof. The polymerizable compound in the present invention may be used alone or in combination of two or more kinds thereof.

More specifically, examples of the monomer and the prepolymer include unsaturated carboxylic acids (for example, acrylic acid, methacrylic acid, itaconic acid, crotonic acid, isocrotonic acid, and maleic acid) or esters thereof, amides, and multimers of these, and among these, an ester of unsaturated carboxylic acid and an aliphatic polyhydric alcohol compound, amides of unsaturated carboxylic acid and an aliphatic polyamine compound, and multimers of these are preferable. Moreover, products of an addition reaction between unsaturated carboxylic acid esters or amides having nucleophilic substituent such as a hydroxyl group, an amino group, and a mercapto group and monofunctional or polyfunctional isocyanates or epoxies, products of a dehydration condensation reaction between the unsaturated carboxylic acid esters having a nucleophilic substituent such as a hydroxyl group, an amino group, and a mercapto group, or amides and a monofunctional or polyfunctional carboxylic acid, and the like are also suitably used. In addition, products of an addition reaction between unsaturated carboxylic acid esters or amides having an electrophilic substituent such as an isocyanate group and an epoxy group and monofunctional or polyfunctional alcohols, amines, or thiols, and products of a substitution reaction between unsaturated carboxylic acid esters or amides having an eliminatable substituent such as a halogen group and a tosyloxy group and monofunctional or polyfunctional alcohols, amines, or thiols are also suitable. Further, as other examples, instead of the above unsaturated carboxylic acid, vinyl benzene derivatives of unsaturated phosphonic acid, styrene, and the like and compound groups substituted with vinyl ether, allyl ether, or the like can also be used.

As these specific compounds, the compounds described in paragraph Nos. "0095" to "0108" of JP2009-288705A can also be suitably used in the present invention.

Moreover, as the polymerizable compound, a compound which has at least one addition-polymerizable ethylene group and has an ethylenically unsaturated group having a boiling point of 100° C. or higher under normal pressure is also preferable. Examples of the compound include a monofunctional acrylate or methacrylate such as polyethylene glycol mono(meth)acrylate, polypropylene glycol mono (meth)acrylate, and phenoxyethyl (meth)acrylate; a compound which is obtained by adding ethylene oxide or propylene oxide to a polyfunctional alcohol, and then (meth) acrylating the resultant, such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta (meth)acrylate, dipentaerythritol hexa(meth)acrylate, hexanediol (meth)acrylate, trimethylolpropane tri(acryloyloxypropyl)ether, tri(acryloyloxyethyl) isocyanurate, glycerin, and trimethylolethane, the urethane (meth)acrylates described in JP1973-41708B (JP-S48-41708B), JP1975-6034B (JP-S50-6034B), and JP1976-37193A (JP-S51-37193A), the polyester acrylates described in JP1973-64183A (JP-S48-64183A), JP1974-43191B (JP-S49-43191B), and JP1977-30490B (JP-S52-30490B), a polyfunctional acrylate or methacrylate such as epoxy acrylate as a product of a reaction between an epoxy resin and a (meth)acrylic acid, and a mixture thereof.

Other examples thereof include a polyfunctional (meth)acrylate which is obtained by reacting a polyfunctional carboxylic acid with a compound having a cyclic ether group such as glycidyl (meth)acrylate, and an ethylenically unsaturated group.

Furthermore, as other preferred polymerizable compounds, the compounds having a fluorene ring and an ethylenically unsaturated group having 2 or more functional groups described in JP2010-160418A, JP2010-129825A, and JP4364216B, and a cardo resin can also be used.

Moreover, as the compound which has a boiling point of 100° C. or higher under normal pressure and has at least one addition-polymerizable ethylenically unsaturated group, compounds described in paragraph Nos. "0254" to "0257" of JP2008-292970A are also suitable.

In addition to those above, radically polymerizable monomers represented by the following General Formulae (MO-1) to (MO-5) can also be suitably used. Incidentally in the case where T is an oxyalkylene group in the formulae, the terminal on a carbon atom side is bonded to R.

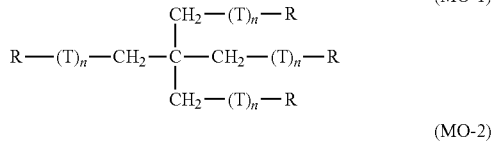
(MO-1)

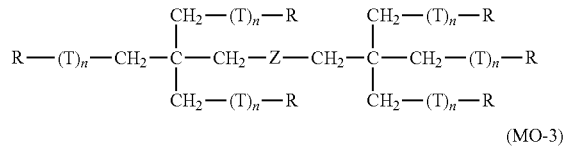
(MO-2)

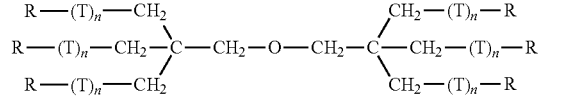
(MO-3)

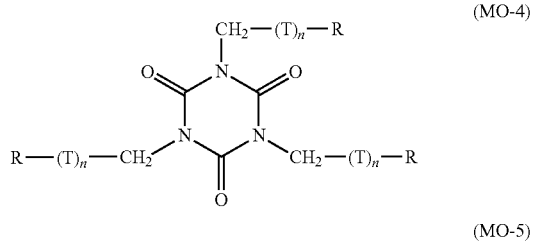
(MO-4)

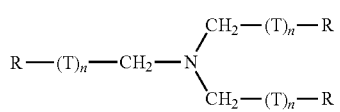
(MO-5)

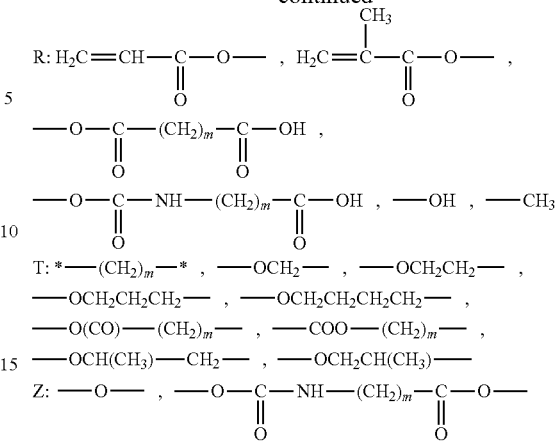

In General Formulae, n is 0 to 14 and m is 1 to 8. A plurality of R's and T's which are present in one molecule may be the same as or different from each other.

In each of the polymerizable compounds represented by General Formulae (MO-1) to (MO-5), at least one of the plurality of R's represents a group represented by $-OC(=O)CH=CH_2$ or $-OC(=O)C(CH_3)=CH_2$.

As specific examples of the polymerizable compounds represented by General Formulae (MO-1) to (MO-5), the compounds described in paragraph Nos. "0248" to "0251" of JP2007-269779A can also be suitably used in the present invention.

In addition, a compound which is obtained by adding ethylene oxide or propylene oxide to the polyfunctional alcohol, which is described as General Formulae (1) and (2) in JP1998-62986A (JP-H10-62986A) together with the specific examples thereof, and then (meth)acrylating the resultant can also be used as a polymerizable compound.

Among these, as the polymerizable compound, dipentaerythritol triacrylate (KAYARAD D-330 as a commercially available product; manufactured by Nippon Kayaku Co., Ltd.), dipentaerythritol tetraacrylate (KAYARAD D-320 as a commercially available product; manufactured by Nippon Kayaku Co., Ltd.), dipentaerythritol pentaacrylate (KAYARAD D-310 as a commercially available product; manufactured by Nippon Kayaku Co., Ltd.), dipentaerythritol hexaacrylate (KAYARAD DPHA as a commercially available product; manufactured by Nippon Kayaku Co., Ltd.), dipentaerythritol hexaacrylate (A-DPH-12E as a commercially available product; manufactured by Shin-Nakamura Chemical Co., Ltd.), and a structure in which an ethylene glycol or propylene glycol residue is interposed between these (meth)acryloyl groups is preferable. Oligomer types of these can also be used. Preferred aspects of the polymerizable compound are shown below.

The polymerizable compound is a polyfunctional monomer and may have an acid group such as a carboxyl group, a sulfonic acid group, and a phosphoric acid group. The method for introducing an acid group into the polymerizable compound is not particularly limited, but the acid group may be introduced by reacting a non-aromatic carboxylic acid anhydride with a hydroxyl group of an ethylenic compound. In this case, specific examples of the non-aromatic carboxylic acid anhydride used include tetrahydrophthalic anhydride, alkylated tetrahydrophthalic anhydride, hexahydrophthalic anhydride, alkylated hexahydrophthalic anhydride, succinic anhydride, and maleic anhydride.

In the present invention, as the polymerizable compound having an acid group, a polyfunctional monomer which is an ester obtained between an aliphatic polyhydroxy compound and an unsaturated carboxylic acid and provides an acid group by reacting an unreacted hydroxyl group of the aliphatic polyhydroxy compound with a non-aromatic carboxylic acid anhydride is preferable. A monomer in which the aliphatic polyhydroxy compound in the ester is pentaerythritol and/or dipentaerythritol is particularly preferable. Examples of commercially available products thereof include M-510 and M-520, which are polybasic acid-modified acryl oligomers manufactured by TOAGOSEI, CO., LTD.

These polymerizable compounds may be used alone, but since it is difficult to use a single compound in production, two or more kinds thereof may be used as a mixture. Moreover, if desired, a polyfunctional monomer not having an acid group and a polyfunctional monomer having an acid group may be used in combination therewith as the polymerizable compound.

The acid value of the polyfunctional monomer having an acid group is preferably 0.1 mgKOH/g to 40 mgKOH/g, and particularly preferably 5 mgKOH/g to 30 mgKOH/g. If the acid value of the polyfunctional monomer is too low, the development solubility characteristics deteriorate. If the acid value is too high, difficulty is caused in the production and handleability, hence a photopolymerization performance deteriorates, which leads to deterioration in curing properties such as surface smoothness of pixels. Therefore, in the case where a combination of two or more kinds of polyfunctional monomers having different acid groups is used, or in the case where a combination of polyfunctional monomers not having an acid group is used, it is preferable to adjust the acid value such that the acid value of all the polyfunctional monomers falls within the above range.

Furthermore, it is also a preferred aspect that a polyfunctional monomer having a caprolactone structure is contained as a polymerizable compound.

The polyfunctional monomer having a caprolactone structure is not particularly limited as long as it has a caprolactone structure in the molecule, and examples thereof include s-caprolactone-modified polyfunctional (meth)acrylates which are obtained by esterifying polyhydric alcohols such as trimethylolethane, ditrimethylolethane, trimethylolpropane, ditrimethyloipropane, pentaerythritol, dipentaerythritol, tripentaerythritol, glycerin, diglycerol, and trimethylolmelamine with (meth)acrylic acid and s-caprolactone. Among these, a polyfunctional monomer having a caprolactone structure represented by the following General Formula (Z-1) is preferable.

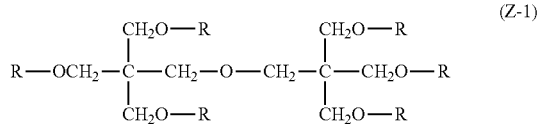

(Z-1)

In General Formula (Z-1), all of six R's are each a group represented by the following General Formula (Z-2). Alternatively, one to five of six R's are a group represented by the following General Formula (Z-2), and the remainder(s) is a group represented by the following General Formula (Z-3).

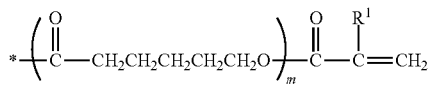

(Z-2)

In General Formula (Z-2), R' represents a hydrogen atom or a methyl group, m represents a number 1 or 2, and "*" represents a bonding hand.

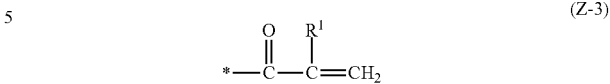

(Z-3)

In General Formula (Z-3), R' represents a hydrogen atom or a methyl group, and "*" represents a bonding hand.

The polyfunctional monomer having such a caprolactone structure is commercially available from Nippon Kayaku Co., Ltd., as a KAYARAD DPCA series, and examples thereof include DPCA-20 (a compound in which m=1 in Formulae (Z-1) to (Z-3), the number of the group represented by Formula (Z-2)=2, and all of $R^1$'s are hydrogen atoms), DPCA-30 (a compound in which m=1 in the same formula, the number of the group represented by Formula (Z-2)=3, and all of $R^1$'s are hydrogen atoms), DPCA-60 (a compound in which m=1 in the same formula, the number of the group represented by Formula (Z-2)=6, and all of $R^1$'s are hydrogen atoms), and DPCA-120 (a compound in which m=2 in the same formula, the number of the group represented by Formula (Z-2)=6, and all of $R^1$'s are hydrogen atoms).

In the present invention, the polyfunctional monomer having a caprolactone structure can be used alone or as a mixture of two or more kinds thereof.

Moreover, the polymerizable compound in the present invention is also preferably at least one kind selected from a group of compounds represented by the following General Formulae (Z-4) and (Z-5).

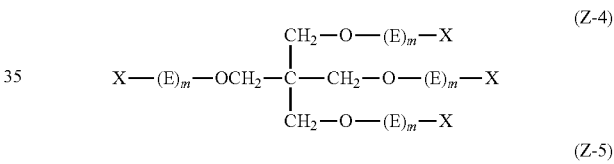

(Z-4)

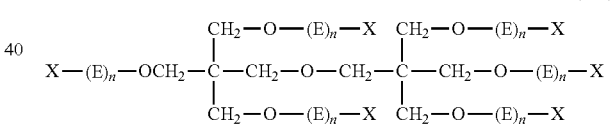

(Z-5)

In General Formulae (Z-4) and (Z-5), E's each independently represent —$((CH_2)_yCH_2O)$— or —$((CH_2)_yCH(CH_3)O)$—, y's each independently represent an integer of 0 to 10, and X's each independently represent an acryloyl group, a methacryloyl group, a hydrogen atom, or a carboxyl group.

In General Formula (Z-4), the sum of the acryloyl group and the methacryloyl group is 3 or 4, m's which are present in plural numbers each independently represent an integer of 0 to 10, and the sum of the respective m's is an integer of 0 to 40. Here, in the case where the sum of the respective m's is 0, any one of X's is a carboxyl group.

In General Formula (Z-5), the sum of the acryloyl group and the methacryloyl group is 5 or 6, n's which are present in plural numbers each independently represent an integer of 0 to 10, and the sum of the respective n's is an integer of 0 to 60. Here, in the case where the sum of the respective n's is 0, any one X's is a carboxyl group.

In General Formula (Z-4), m is preferably an integer of 0 to 6, and more preferably an integer of 0 to 4. Moreover, the sum of the respective m's is preferably an integer of 2 to 40, more preferably an integer of 2 to 16, and particularly preferably an integer of 4 to 8.

In General Formula (Z-5), n is preferably an integer of 0 to 6, and more preferably an integer of 0 to 4. Furthermore, the sum of the respective n's is preferably an integer of 3 to 60, more preferably an integer of 3 to 24, and particularly preferably an integer of 6 to 12.

In addition, —(($CH_2$)$_y$$CH_2$O)— or —(($CH_2$)$_y$CH($CH_3$)O)— in General Formula (Z-4) or (Z-5) is preferably in the form in which the terminal on an oxygen atom side is bonded to X.

The compound represented by General Formula (Z-4) or (Z-5) may be used alone or in combination of two or more kinds thereof. In particular, a form in which all of six X's in General Formula (Z-5) are an acryloyl group is preferable.

Moreover, the total content of the compound represented by General Formula (Z-4) or (Z-5) in the polymerizable compound is preferably 20% by mass or more, and more preferably 50% by mass or more.

The compound represented by General Formula (Z-4) or (Z-5) can be synthesized by steps known in the related art, which includes a step of binding ethylene oxide or propylene oxide to pentaerythritol or dipentaerythritol by a ring-opening addition reaction to form a ring-opening skeleton, and a step of reacting, for example, (meth)acryloyl chloride to a terminal hydroxyl group of the ring-opening skeleton to introduce a (meth)acryloyl group. Since the respective steps are well-known, a person skilled in the art can easily synthesize the compound represented by General Formula (Z-4) or (Z-5).

Among the compounds represented by General Formula (Z-4) or (Z-5), a pentaerythritol derivative and/or a dipentaerythritol derivative is/are more preferable. Specific examples of the compounds include compounds represented by the following Formulae (a) to (f) (hereinafter also referred to as "exemplary compounds (a) to (f)"). Among these, the exemplary compounds (a), (b), (e), and (f) are preferable.

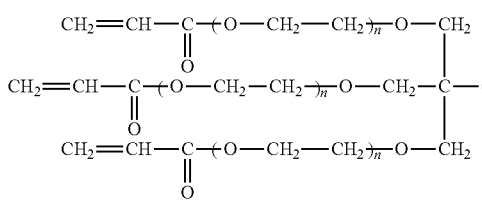
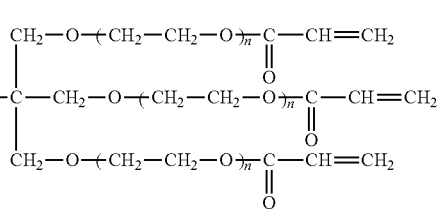

(a)

(the sum of the respective n's is 6)

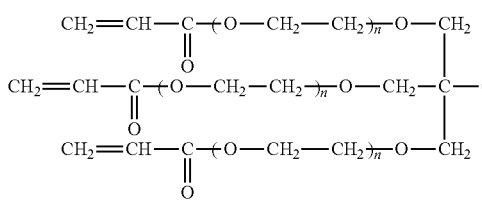
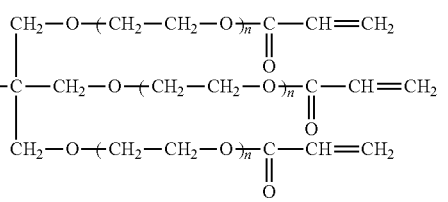

(b)

(the sum of the respective n's is 12)

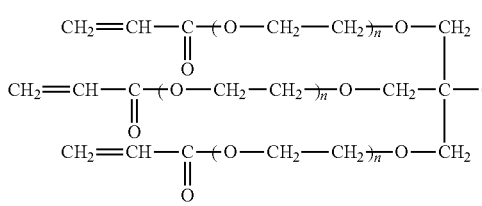
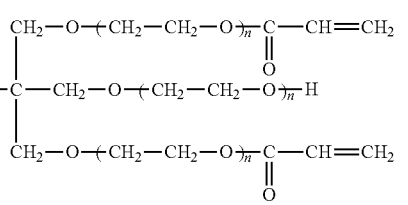

(c)

(the sum of the respective n's is 12)

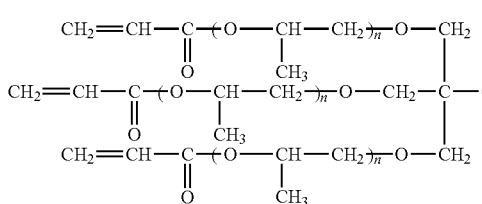
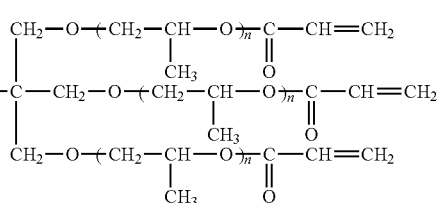

(d)

(the sum of the respective n's is 6)

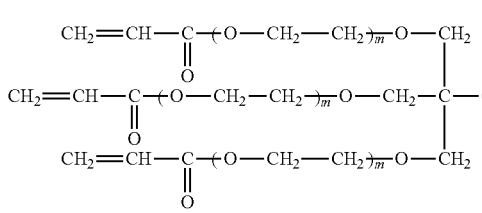

(e)

(the sum of the respective m's is 4)

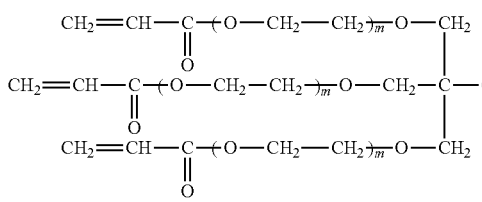 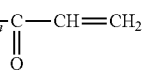 (f)

(the sum of the respective m's is 12)

Examples of commercially available products of the polymerizable compounds represented by General Formulae (Z-4) and (Z-5) include SR-494 which is a tetrafunctional acrylate having four ethyleneoxy chains, manufactured by Sartomer Company, Inc., and DPCA-60 which is a hexafunctional acrylate having six pentyleneoxy chains and TPA-330 which is a trifunctional acrylate having three isobutyleneoxy chains, manufactured by Nippon Kayaku Co., Ltd.

Moreover, as the polymerizable compounds, the urethane acrylates described in JP1973-41708B (JP-S48-41708B), JP1976-37193A (JP-S51-37193A), JP1990-32293B (JP-H02-32293B), and JP1990-16765B (JP-H02-16765B), or the urethane compounds having an ethylene oxide-based skeleton described in JP1983-49860B (JP-S58-49860B), JP1981-17654B (JP-S56-17654B), JP1987-39417B (JP-S62-39417B), and JP1987-39418B (JP-S62-39418B) are also preferable. Furthermore, if addition-polymerizable compounds, which have an amino structure or a sulfide structure in a molecule and are described in JP1988-277653A (JP-S63-277653A), JP1988-260909A (JP-S63-260909A), and JP1989-105238A (JP-H01-105238A), are used as the polymerizable compounds, a composition which is extremely excellent in photosensitization speed can be obtained.

Examples of commercially available products of the polymerizable compounds include urethane oligomers UAS-10 and UAB-140 (manufactured by Sanyo-Kokusaku Pulp, Co., Ltd.), UA-7200 (manufactured by SHIN-NAKAMURA CHEMICAL CO., LTD.), DPHA-40H (manufactured by Nippon Kayaku Co., Ltd.), and UA-306H, UA-306T, UA-306I, AH-600, T-600, and AI-600 (manufactured by KYOEISHA CHEMICAL Co., Ltd.).

Details of the method of using these polymerizable compounds, such as the structure, whether the polymerizable compounds are used alone or used in combination thereof, and the amount of the polymerizable compounds added, can be arbitrarily set according to the designed final performance of the composition. For example, from the viewpoint of the sensitivity, a structure in which the content of an unsaturated group per molecule is large is preferable, and in many cases, it is preferable that the polymerizable compound has 2 or more functional groups. Moreover, from the viewpoint of enhancing the strength of a cured film formed of the composition, it is preferable that the polymerizable compound has 3 or more functional groups. In addition, a method for adjusting both the sensitivity and the strength by using compounds which differ in the number of functional groups and have different polymerizable groups (for example, an acrylic acid ester, a methacrylic acid ester, a styrene-based compound, and a vinylether-based compound) in combination with the other components is also effective. Further, it is preferable to use polymerizable compounds having 3 or more functional groups and differing in the length of an ethylene oxide chain in combination with the other components since the developability of the composition can be adjusted, and excellent pattern formability is obtained.

In addition, from the viewpoints of the compatibility with other components (for example, a photopolymerization initiator, a substance to be dispersed, and an alkali-soluble resin) contained in the composition, and the dispersibility, how to select and use the polymerizable compound is an important factor. For example, if a low-purity compound is used or a combination of two or more kinds thereof is used, the compatibility can be improved in some cases. In addition, there are also cases where specific structures are selected from the viewpoint of improving the adhesiveness to a hard surface of a support or the like.

The content of the polymerizable compound in the composition of the present invention is preferably 0.1% by mass to 70% by mass, more preferably 1.0% by mass to 50% by mass, and particularly preferably 2.0% by mass to 40% by mass, with respect to the total solid content of the composition.

<Other Components>

The composition of the present invention may include other components, in addition to the green colorant, the near-infrared absorbent, and the polymerizable compound as described above. Hereinbelow, the components to be arbitrarily added will be described in detail.

<Binder (D) Including Compound Represented by General Formula (X) as Copolymerization Component>

The composition of the present invention may contain a binder (hereinafter suitably referred to as a "specific binder") including a compound represented by the following General Formula (X) as a copolymerization component. In other words, a binder having a repeating unit derived from the compound represented by General Formula (X) may be contained.

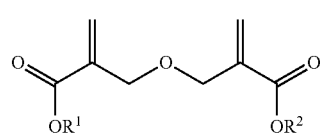

Formula (X)

In General Formula (X), $R^1$ and $R^2$ each independently represent a hydrogen atom or an alkyl group having 1 to 25 carbon atoms. The alkyl group represented by $R^1$ and $R^2$ in General Formula (X) may further have a substituent.

The alkyl group having 1 to 25 carbon atoms, represented by $R^1$ and $R^2$, is not particularly limited, but examples thereof include linear or branched alkyl groups such as methyl, ethyl, n-propyl, isopropyl, n-butyl, isobutyl, t-butyl, t-amyl, stearyl, lauryl, and 2-ethylhexyl; alicyclic groups such as cyclohexyl, t-butylcyclohexyl, dicyclopentadienyl, tricyclodecanyl, isobornyl, adamantyl, and 2-methyl-2-adamantyl; alkyl groups substituted with alkoxy, such as 1-methoxyethyl and 1-ethoxyethyl; and alkyl groups substituted with an aryl group, such as benzyl. Among these, primary or secondary hydrocarbon groups which do not leave easily by an acid or heat, such as methyl, ethyl, cyclohexyl, and benzyl, are preferable in view of heat resistance.

Incidentally, $R^1$ and $R^2$ may be the same substituents or different substituents.

Examples of the compound represented by General Formula (X) include dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(n-butyl)-2,2'-[oxybis(methylene)]bis-2-propenoate, di(t-butyl)-2,2'-[oxybis(methylene)]bis-2-propenoate, and di(isobutyl)-2,2'-[oxybis(methylene)]bis-2-propenoate. Among these, dimethyl-2,2'-[oxybis(methylene)]bis-2-propenoate is particularly preferable.

The specific binder of the present invention may further include a copolymerization component, in addition to the compound represented by General Formula (X). In other words, the specific binder may include a repeating unit derived from a compound (copolymerization component), in addition to the compound represented by General Formula (X).

The copolymerization component other than the compound represented by General Formula (X) is not particularly limited, but aryl (meth)acrylate, alkyl (meth)acrylate, or polyethyleneoxy(meth)acrylate, which imparts oil-solubility, is preferably included as the copolymerization component, from the viewpoint of ease of handling such as solubility in an organic solvent.

Among these, aryl (meth)acrylate or alkyl (meth)acrylate is preferably included as the copolymerization component.

Examples of the aryl (meth)acrylate include benzyl methacrylate.

Examples of the alkyl (meth)acrylate include acylic acid esters and methacylic acid esters having an aliphatic hydroxyl group, such as 2-hydroxyethyl acrylate, 2-hydroxypropyl acrylate, 3-hydroxypropyl acrylate, 4-hydroxybutyl acrylate, 2-hydroxyethyl methacrylate, 2-hydroxypropyl methacrylate, 3-hydroxypropyl methacrylate, and 4-hydroxybutyl methacrylate; methyl acrylate, ethyl acrylate, propyl acrylate, butyl acrylate, isobutyl acrylate, amyl acrylate, hexyl acrylate, 2-ethylhexyl acrylate, octyl acrylate, benzyl acrylate, 2-chloroethyl acrylate, glycidyl acrylate, 3,4-epoxycyclohexylmethyl acrylate, vinyl acrylate, 2-phenylvinyl acrylate, 1-propenyl acrylate, allyl acrylate, 2-allyloxyethyl acrylate, propargyl acrylate, methyl methacrylate, ethyl methacrylate, propyl methacrylate, butyl methacrylate, isobutyl methacrylate, amyl methacrylate, hexyl methacrylate, 2-ethylhexyl methacrylate, cyclohexyl methacrylate, benzyl methacrylate, 2-chloroethyl methacrylate, glycidyl methacrylate, 3,4-epoxycyclohexylmethyl methacrylate, vinyl methacrylate, 2-phenylvinyl methacrylate, 1-propenyl methacrylate, allyl methacrylate, 2-allyloxyethyl methacrylate, and propargyl methacrylate.

Furthermore, from the viewpoint of alkali developability, monomers having a carboxyl group, such as (meth)acrylic acid having an acidic group or itaconic acid, monomers having a phenolic hydroxyl group such as N-hydroxyphenyl maleimide, and monomers having a carboxylic acid anhydride group such as maleic anhydride, or itaconic anhydride are preferably included as a copolymerization component.

Among these, (meth)acrylic acid is preferably included as a copolymerization component.

Moreover, it is a more preferable aspect to add a compound further having a radically polymerizable double bond to a binder including the compound represented by General Formula (X) and a copolymerization component other than the compound since the addition can provide the specific binder with a radiation sensitive group.

The treatment method for adding a compound having a radically polymerizable double bond varies depending on the kinds of monomers which can add the compound having a radically polymerizable double bond. However, for example, in the case where a monomer having a carboxyl group, such as (meth)acrylic acid and itaconic acid, is used, it is necessary to add a compound having an epoxy group and a radically polymerizable double bond, such as glycidyl (meth)acrylate, 3,4-epoxycyclohexylmethyl (meth)acrylate, and o- (or m-, or p-) vinylbenzyl glycidyl ether; in the case where a monomer having a carboxylic acid anhydride group, such as maleic anhydride and itaconic anhydride, is used, it is necessary to add a compound having a hydroxyl group and a radically polymerizable double bond, such as 2-hydroxyethyl (meth)acrylate; and in the case where a monomer having an epoxy group, such as glycidyl (meth)acrylate, 3,4-epoxycyclohexylmethyl (meth)acrylate, and o- (or m-, or p-) vinylbenzyl glycidyl ether, it is necessary to add a compound having an acid group and a radically polymerizable double bond, such as (meth)acrylic acid.

The most preferable combination as a copolymerization component in the specific binder is a specific binder having radiation sensitivity, obtained by reacting a part of a methacrylic acid-derived structure in a copolymer of the compound represented by General Formula (X), benzyl methacrylate, methyl methacrylate, and methacrylic acid with glycidyl methacrylate.

Among these, as the specific binder, the compound represented by General Formula (X) is advantageous from the viewpoint of solubility for a solvent and developability, and a binder obtained by copolymerizing benzyl methacrylate, methyl methacrylate, and/or methacrylic acid as the copolymerization components is particularly preferable.

The content of the copolymerization components of the compound represented by General Formula (X) in the specific binder is preferably 5.0% by mole to 15.0% by mole, more preferably 6.0% by mole to 14.0% by mole, and still more preferably 7.0% by mole to 13.0% by mole.

The copolymerization component for imparting the oil solubility to the specific binder is contained in the specific binder in the proportion of preferably 40% by mole to 70% by mole, and more preferably 45% by mole to 60% by mole. Within this range, the solubility for a solvent is particularly improved.

The copolymerization component containing an acidic group in the specific binder is preferably contained in the proportion of 1.0% by mole to 40.0% by mole, and more preferably 5.0% by mole to 30.0% by mole. By adjusting the proportion to this range, the alkali developability of the composition is improved, and in particular, pattern formability is improved.

Moreover, in the case where a radiation sensitive group is contained in the specific binder, the content of the copolymerization component having the radiation sensitive group is preferably 20% by mole to 30% by mole in the specific binder. By adjusting the content to this range, the curing properties of the composition increases, and thus, the effect of inhibiting color mix of the residue can further be enhanced.

The molecular weight of the specific binder is preferably 5,000 to 14,000, more preferably 8,000 to 13,000, and still more preferably 9,000 to 12,000, in terms of a weight-average molecular weight. With this range, the solubility for a solvent and the developability are improved.

Here, the weight-average molecular weight is a value measured by gel permeation chromatography (GPC) and calculated using polystyrene as a standard. The GPC was measured by means of TSKgel SuperHZM-H, TSKgel SuperHZ4000, and TSKgel SuperHZ200 (manufactured by TOSOH CORPORATION) as the columns, using HLC-8020 GPC (manufactured by TOSOH CORPORATION).

Examples of the specific binder are shown below, but are not limited thereto. Further, the attached number in each structure unit is % by mole. In addition, "Me" represents a methyl group.

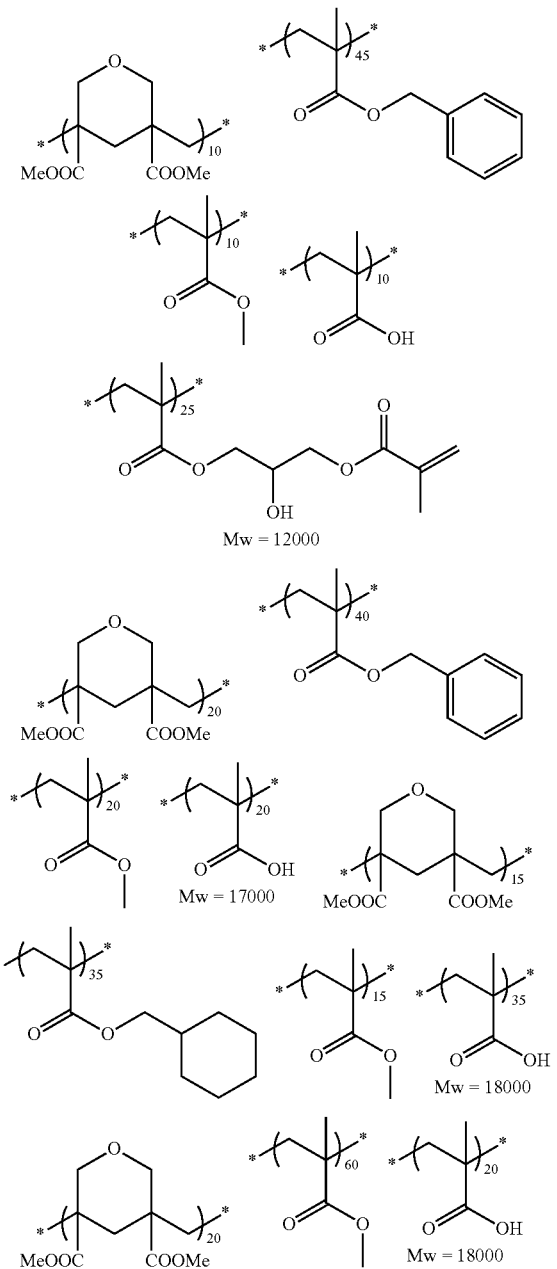

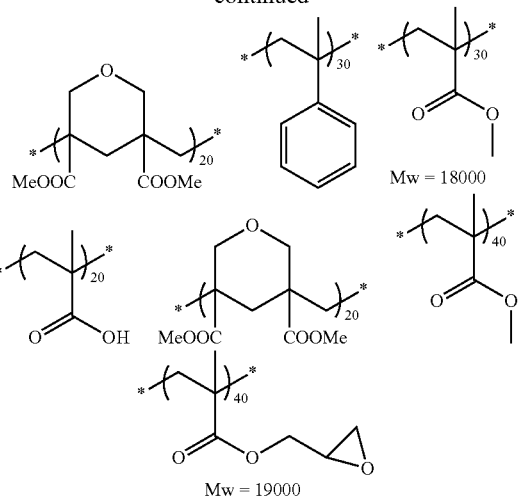

The specific binder can be synthesized according to the method described in JP2004-300204A.

The composition of the present invention may include one kind or two or more kinds of specific binder. Further, the specific binder can be added partly or entirely in the preparation of the pigment dispersion liquid.

The content of the specific binder in the composition was preferably 0.1% by mass to 50.0% by mass, and more preferably 5.0% by mass to 35.0% by mass, with respect to the total solid content of the composition. By adjusting the content to this range, the durability of the colored film is improved.

<Photopolymerization Initiator (E)>

The composition of the present invention may contain a photopolymerization initiator.

As the photopolymerization initiator (hereinafter referred to as a "polymerization initiator" in some cases) in the present invention, those known as a photopolymerization initiator which will be described below can be used.

The photopolymerization initiator in the present invention is not particularly limited as long as it has an ability to initiate polymerization of a polymerizable compound, and can be as appropriate from known photopolymerization initiators. For example, compounds having sensitivity to light in the ultraviolet/visible region are preferable. Further, it may be an activating agent that can interact in some way with a photo-excited sensitizer to give an active radical, or may be an initiator that can initiate cationic polymerization depending on the kind of a monomer.

Furthermore, it is preferable that the photopolymerization initiator contains at least one kind of compound which has a molar light absorption coefficient of at least about 50 in the range of about 300 nm to about 800 nm (more preferably 330 nm to 500 nm).

Examples of the photopolymerization initiator include halogenated hydrocarbon derivatives (for example, those having a triazine skeleton and those having an oxadiazole skeleton), acyl phosphine compounds such as acyl phosphine oxide, hexaarylbiimidazole, oxime compounds such as oxime derivatives, organic peroxides, thio compounds, ketone compounds, aromatic onium salts, keto oxime ethers, aminoacetophenone compounds, and hydroxyacetophenone. Among these, the oxime compounds are preferable.

As the photopolymerization initiator, a hydroxyacetophenone compound, an aminoacetophenone compound, and an acyl phosphine compound can also be suitably used. More specifically, for example, the aminoacetophenone-based initiator described in JP1998-291969A (JP-H10-291969A), and the acyl phosphine oxide-based initiator described in JP4225898B can also be used.

As the hydroxyacetophenone-based initiator, IRGA-CURE-184, DAROCUR-1173, IRGACURE-500, IRGA-CURE-2959, and IRGACURE-127 (product names, all manufactured by BASF) can be used. As the aminoacetophenone-based initiator, IRGACURE-907, IRGACURE-369, and IRGACURE-379 (product names, all manufactured by BASF) which are commercially available products can be used. In addition, as the aminoacetophenone-based initiator, the compound described in JP2009-191179A, of which an absorption wavelength matches a light source with a long wavelength of 365 nm, 405 nm, or the like can be used. Moreover, as the acyl phosphine-based initiator, IRGACURE-819 or DAROCUR-TPO (product names, both manufactured by BASF) which are commercially available products can be used.

Examples of the photopolymerization initiator more preferably include oxime compounds. As specific examples of the oxime compounds, the compound described in JP2001-233842A, the compound described in JP2000-80068A, or the compound described in JP2006-342166A can be used.

Examples of the oxime compound such as an oxime derivative that is preferably used as the polymerization initiator in the present invention include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Examples of the oxime compound include the compounds described in J. C. S. Perkin II (1979), pp. 1653-1660, J. C. S. Perkin II (1979), pp. 156-162, Journal of Photopolymer Science and Technology (1995), pp. 202-232, and JP2000-66385A; and the compounds described respectively in JP2000-80068A, JP2004-534797A, and JP2006-342166A.

As the commercially available product, IRGACURE OXE01 (manufactured by BASF) and IRGACURE OXE02 (manufactured by BASF) are also suitably used.

As oxime compounds other than the above, the compound described in JP2009-519904A in which oxime is linked to the N-position of carbazole, the compound described in U.S. Pat. No. 7,626,957B in which a hetero-substituent is introduced into a benzophenone moiety, the compounds described in JP2010-15025A and US2009/292039A in which a nitro group is introduced into a dye moiety, the ketoxime compound described in WO2009/131189A, the compound described in U.S. Pat. No. 7,556,910B that contains a triazine skeleton and an oxime skeleton in the same molecule, the compound described in JP2009-221114A that exhibits maximum absorption at 405 nm and exhibits excellent sensitivity to a light source of a g-line, and the like may be used.

Moreover, the cyclic oxime compounds described in JP2007-231000A and JP2007-322744A can also be suitably used. Among the cyclic oxime compounds, the cyclic oxime compounds condensed to a carbazole dye, which are described in JP2010-32985A and JP2010-185072A, are preferable from the viewpoints that they have a high degree of light absorptivity and make it possible to improve sensitivity.

Furthermore, the compound described in JP2009-242469A, which is an oxime compound having an unsaturated bond in a specific moiety, can also be suitably used since this compound makes it possible to improve sensitivity by reproducing active radicals from polymerization-inactive radicals.

The most preferred examples of the oxime compounds include the oxime compound having a specific substituent described in JP2007-269779A and the oxime compound having a thioaryl group described in JP2009-191061A.

In particular, as the oxime compound, a compound represented by the following Formula (OX-1) is preferable. Moreover, the compound may be an oxime compound in which an N—O bond of oxime forms an (E) isomer, an oxime compound in which the N—O bond forms a (Z) isomer, or a mixture in which the N—O bond forms a mixture of an (E) isomer and a (Z) isomer.

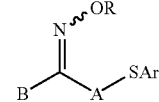

(OX-1)

(In Formula (OX-1), R and B each independently represent a monovalent substituent, A represents a divalent organic group, and Ar represents an aryl group.)

In Formula (OX-1), the monovalent substituent represented by R is preferably a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. Moreover, the above substituents may further be substituted with other substituents.

Examples of the substituent include a halogen atom, an aryloxy group, an alkoxycarbonyl group, an aryloxycarbonyl group, an acyloxy group, an acyl group, an alkyl group, and an aryl group.

As for specific examples of the alkyl group which may have a substituent, the aryl group which may have a substituent, the acyl group which may have a substituent, the alkoxycarbonyl group which may have a substituent, the aryloxycarbonyl group which may have a substituent, the heterocyclic group which may have a substituent, the alkylthiocarbonyl group which may have a substituent, and the arylthiocarbonyl group which may have a substituent, reference can be made to descriptions of paragraphs "0131" to "0138" of JP2012-173635A, the contents of which are hereby incorporated.

In Formula (OX-1), the monovalent substituent represented by B represents an aryl group, a heterocyclic group, an arylcarbonyl group, or a heterocyclic carbonyl group. Further, these groups may have one or more substituents, and examples of the substituents include the substituents described above. Moreover, the substituents described above may further be substituted with other substituents.

Among these, the structures shown below are particularly preferable.

In the following structures, Y, X, and n have the same definitions as Y, X, and n in Formula (OX-2) which will be described later, and preferred examples thereof are also the same.

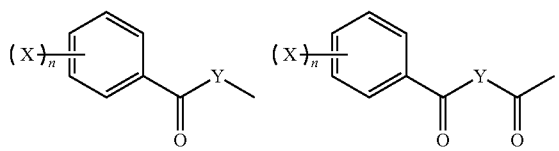

In Formula (OX-1), examples of the divalent organic group represented by A include an alkylene group having 1 to 12 carbon atoms, a cycloalkylene group, and an alkynylene group, and these groups may have one or more substituents. Examples of the substituents include the substituents described above. Further, the substituents described above may be further substituted with other substituents.

Among these, as A in Formula (OX-1), from the viewpoints of improving the sensitivity and inhibiting the coloration caused by elapse of time during heating, an unsubstituted alkylene group, an alkylene group substituted with an alkyl group (for example, a methyl group, an ethyl group, a tert-butyl group, and a dodecyl group), an alkylene group substituted with an alkenyl group (for example, a vinyl group and an allyl group), and an alkylene group substituted with an aryl group (for example, a phenyl group, a p-tolyl group, a xylyl group, a cumenyl group, a naphthyl group, an anthryl group, a phenanthryl group, and a styryl group) are preferable.

In Formula (OX-1), the aryl group represented by Ar is preferably an aryl group having 6 to 30 carbon atoms, and may have a substituent. Examples of the substituent include the same ones as the substituents introduced into the substituted aryl groups, which are exemplified above as specific examples of the aryl group which may have a substituent. Among these, from the viewpoints of improving the sensitivity and inhibiting the coloration caused by elapse of time during heating, a substituted or unsubstituted phenyl group is preferable.

In Formula (OX-1), a structure "SAr" formed of Ar and S adjacent thereto in Formula (OX-1) is preferably the following structure from the viewpoint of the sensitivity. Incidentally, Me represents a methyl group, and Et represents an ethyl group.

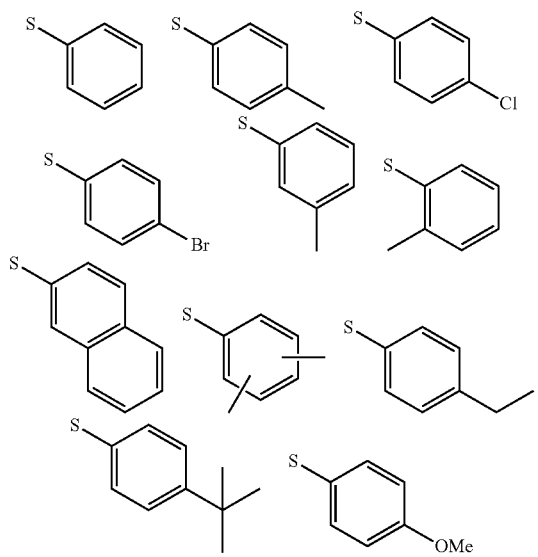

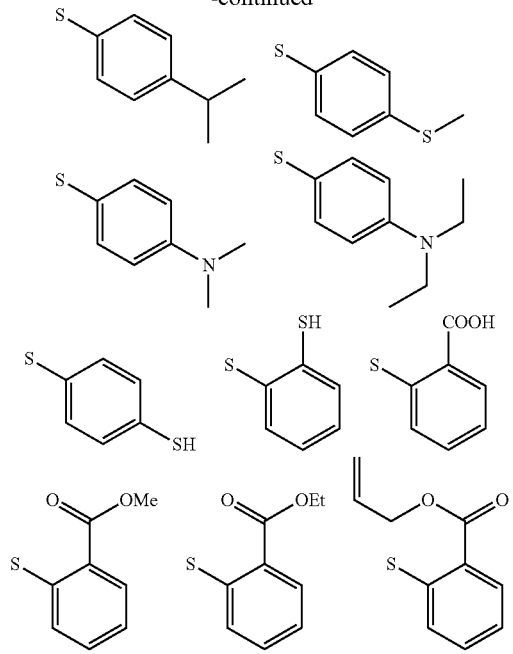

The oxime compound is preferably a compound represented by the following Formula (OX-2).

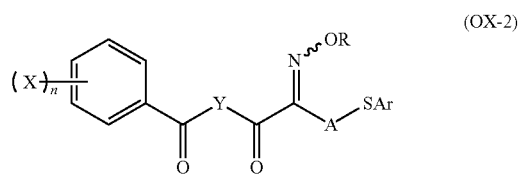

(In Formula (OX-2), R and X each independently represent a monovalent substituent, A and Y each independently represent a divalent organic group, Ar represents an aryl group, and n represents an integer from 0 to 5.)

R, A, and Ar in Formula (OX-2) have the same definitions as R, A, and Ar in Formula (OX-1), and preferred examples thereof are also the same.

Examples of the monovalent substituent represented by X in General Formula (OX-2) include an alkyl group, an aryl group, an alkoxy group, an aryloxy group, an acyloxy group, an acyl group, an alkoxycarbonyl group, an amino group, a heterocyclic group, and a halogen atom. These groups may have one or more substituents, and examples of the substituents include the substituents described above. Moreover, the substituents described above may be further substituted with other substituents.

Among these, in view of improving the solvent solubility and the absorption efficiency in a long-wavelength region, X in Formula (OX-2) is preferably an alkyl group.

Furthermore, n in Formula (2) represents an integer of 0 to 5 and preferably represents an integer of 0 to 2.

Examples of the divalent organic group represented by Y in Formula (OX-2) include the following structures. In the following groups, "*" represents a position where Y is bonded to an carbon atom adjacent thereto in General Formula (OX-2).

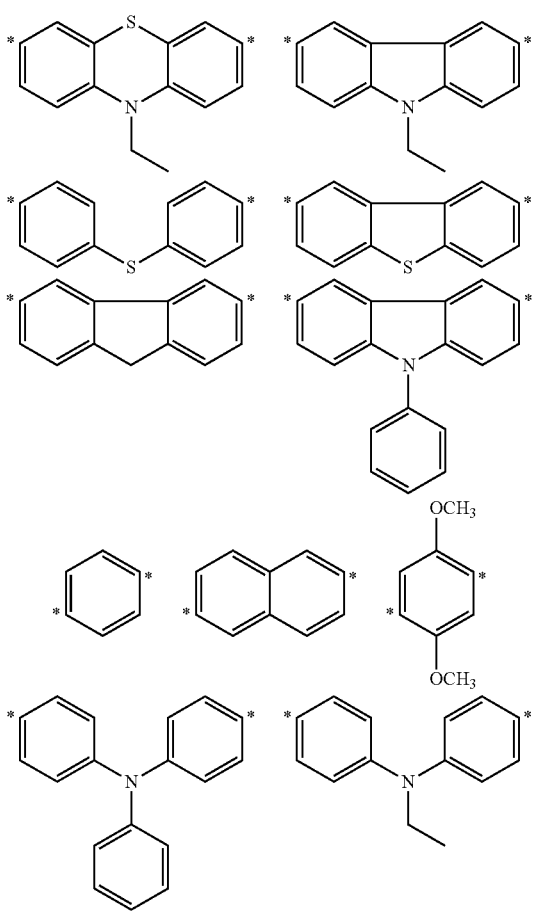

Among these, from the viewpoint of improving the sensitivity, the following structures are preferable.

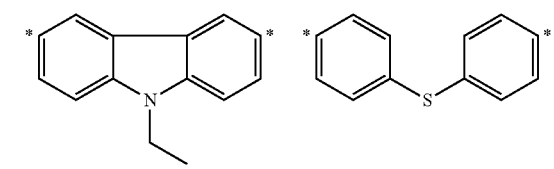

Moreover, the oxime compound is preferably a compound represented by the following Formula (OX-3).

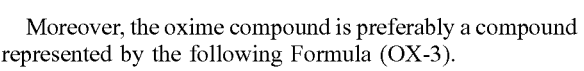
(OX-3)

(In Formula (OX-3), R and X each independently represent a monovalent substituent, A represents a divalent organic group, Ar represents an aryl group, and n represents an integer of 0 to 5.)

R, X, A, Ar, and n in Formula (OX-3) each have the same definitions as R, X, A, Ar, and n in the Formula (OX-2), and preferred examples thereof are also the same.

Specific examples of the oxime compound that are suitably used are shown below, but the present invention is not limited thereto.

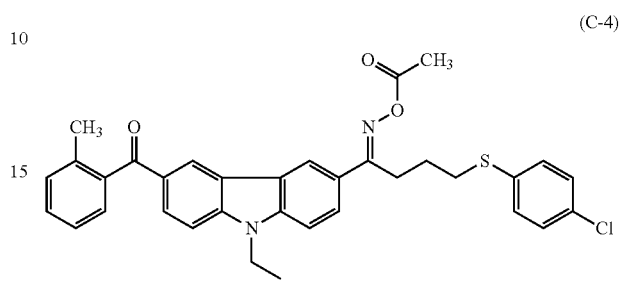
(C-4)

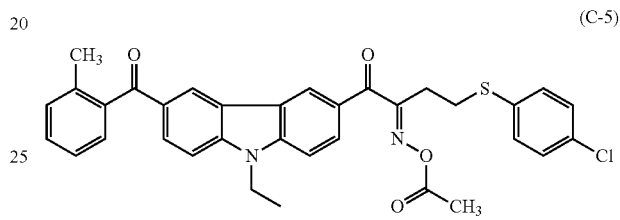
(C-5)

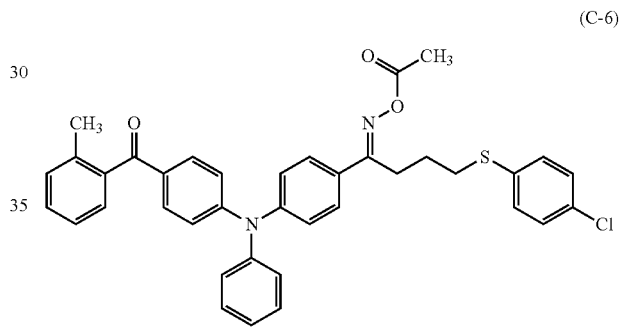
(C-6)

(C-7)

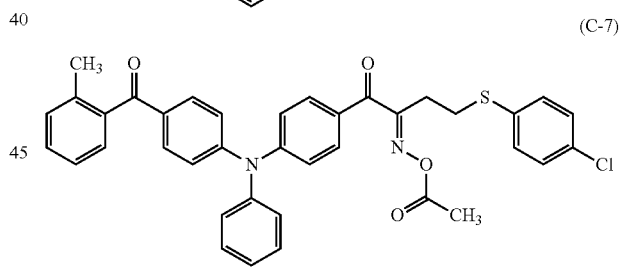

(C-8)

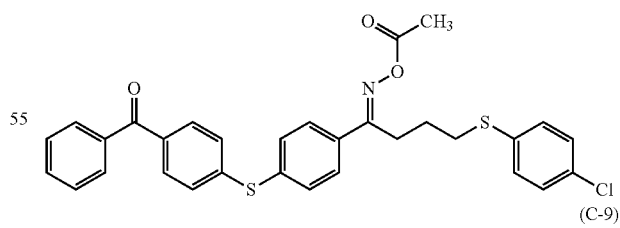

(C-9)

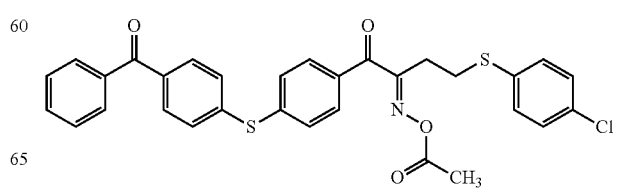

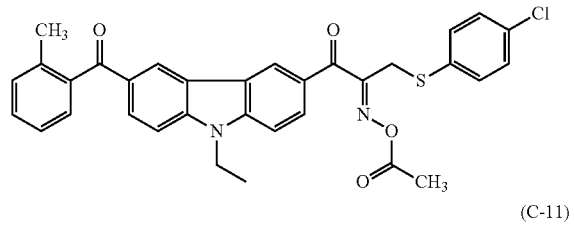
(C-10)

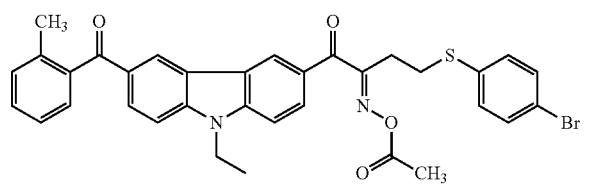
(C-11)

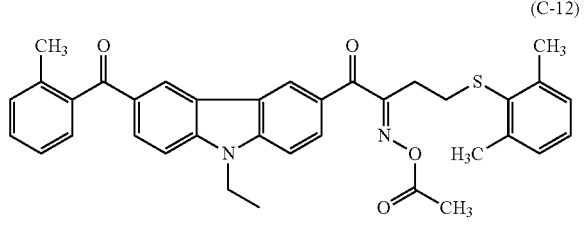
(C-12)

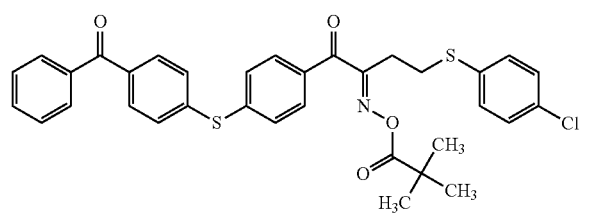
(C-13)

The oxime compound has a maximum absorption wavelength in a wavelength region of 350 nm to 500 nm, and preferably in a wavelength region of 360 nm to 480 nm, and an oxime compound showing a high absorbance at 365 nm and 405 nm is particularly preferable.

From the viewpoint of sensitivity, the molar light absorption coefficient at 365 nm or 405 nm of the oxime compound is preferably 1,000 to 300,000, and more preferably 2,000 to 300,000, and particularly preferably 5,000 to 200,000.

The molar light absorption coefficient of the compound can be measured using a known method, but specifically, it is preferable to measure the molar light absorption coefficient by means of, for example, an ultraviolet-visible spectrophotometer (Carry-5 spectrophotometer manufactured by Varian) by using an ethyl acetate solvent at a concentration of 0.01 g/L.

If desired, the polymerization initiator used in the present invention may be used in combination of two or more kinds thereof.

Particularly, in the case where the coloring composition of the present invention is used for the manufacture of a color filter included in a solid-state imaging device, it is necessary to form a fine pattern in a sharp shape. Accordingly, it is important that the composition has curing properties and is developed without residues in an unexposed area. From this viewpoint, it is particularly preferable to use an oxime compound as a polymerization initiator. In particular, in the case where a fine pattern is formed in the solid-state imaging device, stepper exposure is used for exposure for curing. However, the exposure machine used at this time is damaged by halogen in some cases, so it is necessary to reduce the amount of a polymerization initiator added. Taking into consideration this point, it is most preferable to use an oxime compound as the polymerization initiator in order to form a fine pattern as in a solid-state imaging device.

The content of the polymerization initiator contained in the composition of the present invention is preferably 0.1% by mass to 50% by mass, more preferably 0.5% by mass to 20% by mass, and still more preferably 1% by mass to 15% by mass, with respect to the total solid content of the composition. Within this range, good sensitivity and pattern formability can be obtained.

<Organic Solvent (F)>

The composition of the present invention may contain an organic solvent.

Examples of the organic solvent include: esters such as ethyl acetate, n-butyl acetate, amyl formate, isoamyl acetate, isobutyl acetate, butyl propionate, isopropyl butyrate, ethyl butyrate, butyl butyrate, methyl lactate, ethyl lactate, alkyl oxyacetate (for example, methyl oxyacetate, ethyl oxyacetate, and butyl oxyacetate (for example, methyl methoxyacetate, ethyl methoxyacetate, butyl methoxyacetate, methyl ethoxyacetate, and ethyl ethoxyacetate)), alkyl 3-oxypropionate esters (for example, methyl 3-oxypropionate and ethyl 3-oxypropionate (for example, methyl 3-methoxypropionate, ethyl 3-methoxypropionate, methyl 3-ethoxypropionate, and ethyl 3-ethoxypropionate)), alkyl 2-oxypropionate esters (for example, methyl 2-oxypropionate, ethyl 2-oxypropionate, or propyl 2-oxypropionate (for example, methyl 2-methoxypropionate, ethyl 2-methoxypropionate, propyl 2-methoxypropionate, methyl 2-ethoxypropionate, or ethyl 2-ethoxypropionate)), methyl 2-oxy-2-methyl propionate and ethyl 2-oxy-2-methyl propionate (for example, methyl 2-methoxy-2-methyl propionate or ethyl 2-ethoxy-2-methyl propionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, 2-heptanone, and 3-butanone; and aromatic hydrocarbons such as toluene and xylene.

The organic solvents may be used alone or in combination of two or more kinds thereof.

In the case of using the organic solvents in combination of two or more kinds thereof, a mixed solution composed of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether, and propylene glycol methyl ether acetate as described above is particularly preferable.

The content of the organic solvent included in the composition is preferably 10% by mass to 90% by mass, more preferably 20% by mass to 80% by mass, and still more preferably 25% by mass to 75% by mass, with respect to the total amount of the composition.

<Sensitizer (G)>

The composition of the present invention may contain a sensitizer for the purpose of improving the generation efficiency of an initiator and shifting the photosensitive wavelength to a longer wavelength. Examples of the sensitizer include sensitizers having an absorption wavelength in the wavelength region of 300 nm to 450 nm.

Examples of the sensitizer include polynuclear aromatic compounds such as phenanthrene, anthracene, pyrene, perylene, triphenylene, and 9,10-dialkoxyanthracene; xanthenes such as fluorescein, eosin, erythrosin, Rhodamine B, and Rose Bengal; thioxantones, cyanines, merocyanines, phthalocyanines; thiazines such as thionine, methylene blue, and toluidine blue; acridines, anthraquinones, squaryliums, coumarins, phenothiazines, phenazines, styrylbenzenes, azo compounds, diphenylmethanes, triphenylmethanes, distyrylbenzenes, carbazoles, porphyrin, spiro compounds, quinacridone compounds, indigo compounds, styryl compounds, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, and Michler's ketone, and heterocyclic compounds such as N-aryloxazolidinone.

<Chain Transfer Agent (H)>

It is preferable to add a chain transfer agent to the composition of the present invention, depending on the photopolymerization initiator used. Examples of the chain transfer agent include alkyl esters of N,N-dialkyl amino benzoic acid and thiol compounds, and examples of the thiol compounds include 2-mercapto benzothiazole, 2-mercapto-1-phenyl benzimidazole, and 3-mercapto propionate. These thiol compounds may be used alone or in combination of two or more kinds thereof.

<Alkali Soluble Resin (I)>

It is also preferable that the composition of the present invention further contains an alkali-soluble resin. By incorporating the alkali-soluble resin, the developability and the pattern formability are improved.

The alkali-soluble resin can be appropriately selected from alkali-soluble resins which are linear organic high molecular-weight polymers having a different structure from that of a specific binder and have at least one group enhancing alkali solubility in a molecule (preferably a molecule having an acrylic copolymer or a styrene-based copolymer as a main chain). From the viewpoint of heat resistance, a polyhydroxystyrene-based resin, a polysiloxane-based resin, an acrylic resin, an acrylamide-based resin, and an acryl/acrylamide copolymer resin are preferable, and further, from the viewpoint of controlling developability, an acrylic resin, an acrylamide-based resin, an acryl/acrylamide copolymer resin are preferable.

Examples of the group enhancing alkali solubility (hereinafter, also referred to as an acid group) include a carboxyl group, a phosphoric acid group, a sulfonic acid group, and a phenolic hydroxyl group. The group enhancing alkali solubility is preferably a group that is soluble in an organic solvent and can be developed by an aqueous weak alkaline solution, and particularly preferred examples thereof include (meth)acrylic acid. One kind or two or more kinds of the acid groups may be used.

Examples of the monomer which can give the acid group after polymerization include monomers having a hydroxyl group, such as 2-hydroxyethyl (meth)acrylate, monomers having an epoxy group, such as glycidyl (meth)acrylate, and monomers having an isocyanate group, such as 2-isocyanatoethyl (meth)acrylate. The monomers for introducing these acid groups may be used alone or in combination of two or more kinds thereof. In order to introduce the acid group into the alkali-soluble binder, for example, the monomer having the acid group and/or the monomer which can give the acid group after polymerization (hereinafter referred to as a "monomer for introducing an acid group" in some cases) may be polymerized as a monomer component. Incidentally, in the case where a monomer which can apply the acid group after polymerization is used as a monomer component to introduce the acid group, a treatment for applying the acid group, which will be described later, is required after polymerization.

For production of the alkali-soluble resin, for example, a method using known radical polymerization can be applied. Various polymerization conditions for producing the alkali-soluble resin by radical polymerization, such as a temperature, a pressure, the type and amount of a radical initiator, and the type of a solvent, can be easily set by those skilled in the art, and the conditions can also be determined experimentally.

As the linear organic high-molecular-weight polymer used as the alkali-soluble resin, polymers having a carboxylic acid in a side chain are preferable, and examples thereof include a methacrylic acid copolymer, an acrylic acid copolymer, an itaconic acid copolymer, a crotonic acid copolymer, a maleic acid copolymer, a partially esterified maleic acid copolymer, an alkali-soluble phenol resin or the like such as a novolac resin, an acidic cellulose derivative having a carboxylic acid in a side chain, and a polymer obtained by adding an acid anhydride to a polymer having a hydroxyl group. In particular, a copolymer of a (meth)acrylic acid and another monomer copolymerizable with the (meth)acrylic acid is suitable as the alkali-soluble resin. Examples of another monomer copolymerizable with a (meth)acrylic acid include alkyl (meth)acrylate, aryl (meth)acrylate, and a vinyl compound. Examples of the alkyl (meth)acrylate and aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, and cyclohexyl (meth)acrylate. Examples of the vinyl compound include styrene, α-methylstyrene, vinyltoluene, glycidyl methacrylate, acrylonitrile, vinyl acetate, N-vinylpyrrolidone, tetrahydrofurfuryl methacrylate, a polystyrene macromonomer, and a polymethyl methacrylate macromonomer. Examples of the N-position-substituted maleimide monomer described in JP1998-300922A (JP-H10-300922A) include N-phenylmaleimide and N-cyclohexylmaleimide. Incidentally, other monomers copolymerizable with a (meth)acrylic acid may be used alone or in combination of two or more kinds thereof.

The alkali-soluble phenol resin may be suitably used when the composition of the present invention is formed into a positive-type composition. Examples of the alkali-soluble phenol resin include a novolac resin and a vinyl polymer.

Examples of the novolac resin include those obtained from condensation of phenols with aldehydes in the presence of an acid catalyst. Examples of the phenols include phenol, cresol, ethylphenol, butylphenol, xylenol, phenylphenol, catechol, resorcinol, pyrogallol, naphthol, and bisphenol A.

Examples of the aldehydes include formaldehyde, paraformaldehyde, acetaldehyde, propionaldehyde, and benzaldehyde.

The phenols and the aldehydes may be used alone or in combination of two or more kinds thereof.

Specific examples of the novolac resin include metacresol, paracresol or a condensed product of this mixture and formalin may be included.

The molecular weight distribution of the novolac resin may be adjusted using means such as fractionation. Further, a low-molecular-weight component having a phenolic hydroxyl group such as bisphenol C and bisphenol A may be mixed with the novolac resin.

Moreover, in order to improve the cross-linking efficiency of the composition in the present invention, an alkali-soluble resin having the polymerizable group may also be used. As the alkali-soluble resin having the polymerizable group, an alkali-soluble resin including an allyl group, a (meth)acrylic group, an allyloxy alkyl group, or the like in a side chain, and the like is useful. Examples of the polymer containing the above polymerizable group include Dianal NR series (manufactured by Mitsubishi Rayon Co., Ltd.), Photomer 6173 (a polyurethane acrylic oligomer containing COOH, manufactured by Diamond Shamrock Co., Ltd.), Biscoat R-264 and KS Resist 106 (all manufactured by OSAKA ORGANIC CHEMICAL INDUSTRY LTD.), Cyclomer P series and Placcel CF200 series (all manufactured by DAICEL Corporation), and Ebecryl 3800 (manufactured by DAICEL-UCB Co., Ltd.).

As the alkali-soluble resin having these polymerizable groups, a urethane-modified polymerizable double bond contained acrylic resin obtained by reacting an isocyanate group with a OH group in advance, leaving one unreacted isocyanate group, and also reacting a compound including a (meth)acryloyl group with an acrylic resin including a carboxyl group, an unsaturated group contained acrylic resin obtained by reacting an acrylic resin including a carboxyl group with a compound having both an epoxy group and a polymerizable double bond within the molecule, an acid pendant type epoxy acrylate resin, a polymerizable double bond contained acrylic resin in which an acrylic resin including a OH group and a dibasic acid anhydride having a polymerizable double bond are reacted, a resin in which an acrylic resin including a OH group, isocyanate, and a compound having a polymerizable double bond are reacted, a resin obtained by base-treating the resin having an ester group which has a dissociating group such as a halogen atom or a sulfonate group at an α-position or a β-position in a side chain disclosed in JP2002-229207A and JP2003-335814A, or the like is preferable.

As the alkali-soluble resin, in particular, a benzyl (meth)acrylate/(meth)acrylic acid copolymer or a multicomponent copolymer composed of benzyl (meth)acrylate/(meth)acrylic acid/other monomer is suitable. In addition, a copolymer in which 2-hydroxyethyl methacrylate is copolymerized, and a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/benzyl methacrylate/methacrylic acid copolymer, a 2-hydroxyethyl methacrylate/polystyrene macromonomer/methyl methacrylate/methacrylic acid copolymer, and a 2-hydroxyethyl methacrylate/polystyrene macromonomer/benzyl methacrylate/methacrylic acid copolymer described in JP1995-140654A (JP-H07-140654A).

The acid value of the alkali-soluble resin is preferably 10 mgKOH/g to 200 mgKOH/g, more preferably 20 mgKOH/g to 150 mgKOH/g, and still more preferably 30 mgKOH/g to 120 mgKOH/g.

Furthermore, the weight-average molecular weight (Mw) of the alkali-soluble resin is preferably 2,000 to 50,000, more preferably 5,000 to 30,000, and still more preferably 7,000 to 20,000.

The content of the alkali-soluble resin in the composition is preferably 1% by mass to 15% by mass, more preferably 2% by mass to 12% by mass, and particularly preferably 3% by mass to 10% by mass, with respect to the total solid content of the composition. However, the content of the specific binder in the present invention is preferably 50% by mass or less.

<Polymerization Inhibitor (J)>

It is preferable to add a small amount of a polymerization inhibitor to the composition of the present invention in order to prevent undesirable thermal polymerization of the polymerizable compound during the production or preservation of the composition.

Examples of the polymerization inhibitor which can be used in the present invention include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), and a cerous salt of N-nitrosophenylhydroxylamine. Among these, p-methoxyphenol is preferable.

The amount of the polymerization inhibitor to be added is preferably about 0.01% by mass to about 5% by mass with respect to the mass of the composition.

<Substrate Adhesion Agent (K)>

Moreover, in the present invention, a substrate adhesion agent capable of increasing the adhesiveness to a substrate may be added to the composition.

As the substrate adhesion agent, a silane-based coupling agent, a titanate-based coupling agent or an aluminum-based coupling agent is preferably used. As the silane-based coupling agent, for example, γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, and phenyltrimethoxysilane. Among these, γ-methacryloxypropyltrimethoxysilane is preferable as the substrate adhesion agent.

The content of the substrate adhesion agent is preferably 0.1% by mass to 30% by mass, more preferably 0.5% by mass to 20% by mass, and particularly preferably 1% by mass to 10% by mass, based on the total solid content of the composition of the present invention from the viewpoint of leaving no residues in the unexposed area when the composition is exposed and developed.

<Surfactant (L)>

Various surfactants may be added to the composition of the present invention from the viewpoint of further improving coatability. As the surfactant, various surfactants such as a fluorine-based surfactant, a nonionic surfactant, a cationic surfactant, an anionic surfactant, and a silicone-based surfactant can be used.

In particular, by incorporating a fluorine-based surfactant into the composition of the present invention, liquid characteristics (in particular, fluidity) of a coating solution prepared are further enhanced so that the uniformity of the coating thickness or the liquid saving property can further be improved. That is, in the case of forming a film by using a coating solution prepared from the composition containing a fluorine-based surfactant, the interface tension between the surface to be coated and the coating solution is reduced, whereby wettability to the surface to be coated is improved and the coating property on the surface to be coated is enhanced. This is effective in that even in the case where a thin film of about several μm is formed with a small liquid volume, a film formation with little thickness unevenness and a uniform thickness can be more suitably carried out.

The fluorine content in the fluorine-based surfactant is preferably 3% by mass to 40% by mass, more preferably 5% by mass to 30% by mass, and particularly preferably 7% by mass to 25% by mass. The fluorine-based surfactant having the fluorine content in the range described above is effective in view of the uniformity of the coating film thickness and the liquid saving property, and the solubility thereof in the composition is also good.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F479, MEGAFACE F482, MEGAFACE F780, and MEGAFACE F781F (all manufactured by DIC Corporation), Fluorad FC430, FC431, and FC171 (all manufactured by Sumitomo 3M), and Surflon S-382, Surflon SC-101, Surflon SC-103, Surflon SC-104, Surflon SC-105, Surflon SC1068, Surflon SC-381, Surflon SC-383, Surflon 5393, and Surflon KH-40 (all manufactured by ASAHI GLASS Co., Ltd.).

Specific examples of the nonionic surfactant include polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, sorbitan fatty acid esters (Pluronic L10, L31, L61, L62, 10R5, 17R2, and 25R2, and Tetronic 304, 701, 704, 901, 904, and 150R1 manufactured by BASF), and Solseperse 20000 (manufactured by The Lubrizol Corporation).

Furthermore, specific examples of the nonionic surfactant include "PIONIN D-6112-W", "PIONIN D-6315", and "PIONIN D-6512", manufactured by Takemoto Oil & Fat Co., Ltd.

Specific examples of the cationic surfactant include phthalocyanine derivatives (product name: EFKA-745 manufactured by MORISHITA KAGAKU SANGYO Corporation), organosiloxane polymer KP341 (manufactured by Shin-Etsu Chemical Co., Ltd.), (meth)acrylic acid-based (co)polymer Polyflow No. 75, No. 90, and No. 95 (manufactured by KYOEISHA CHEMICAL CO., LTD.), and W001 (manufactured by Yusho Co., Ltd.).

Specific examples of the anionic surfactant include W004, W005, and W017 (manufactured by Yusho Co., Ltd.).

Examples of the silicone-based surfactant include "Toray Silicone DC3PA", "Toray Silicone SH7PA", "Toray Silicone DC11PA", "Toray Silicone SH21PA", "Toray Silicone SH28PA", "Toray Silicone SH29PA", "Toray Silicone SH30PA", and "Toray Silicone SH8400", manufactured by Dow Corning Toray, "TSF-4440", "TSF-4300", "TSF-4445", "TSF-444(4)(5)(6)(7)6", "TSF-4460", and "TSF-4452", manufactured by Momentive Performance Materials Inc., "KP341" manufactured by Shin-Etsu Chemical Co., Ltd., and "BYK323" and "BYK330", manufactured by BYK Additives & Instruments.

The surfactants may be used alone or in combination of two or more kinds thereof.

The content of the surfactant in the composition is preferably 0.001% by mass to 5% by mass, and more preferably 0.01% by mass to 1% by mass, with respect to the total solid content of the composition.

<Organic Carboxylic Acid and Organic Carboxylic Anhydride (M)>

The composition of the present invention may contain an organic carboxylic acid having a molecular weight of 1,000 or less, and/or an organic carboxylic anhydride.

Specific examples of the organic carboxylic acid compound include an aliphatic carboxylic acid and an aromatic carboxylic acid. Examples of the aliphatic carboxylic acid include monocarboxylic acids such as formic acid, acetic acid, propionic acid, butyric acid, valeric acid, pivalic acid, caproic acid, glycolic acid, acrylic acid, and methacrylic acid, dicarboxylic acids such as oxalic acid, malonic acid, succinic acid, glutaric acid, adipic acid, pimelic acid, cyclohexanedicarboxylic acid, cyclohexenedicarboxylic acid, itaconic acid, citraconic acid, maleic acid, and fumaric acid, tricarboxylic acids such as tricarballylic acid and aconitic acid, and the like. Examples of the aromatic carboxylic acid include carboxylic acids in which a carboxyl group is directly bonded to a phenyl group such as a benzoic acid and a phthalic acid, and carboxylic acids in which a phenyl group is bonded to a carboxyl group via a carbon bond. Among these, carboxylic acids having a molecular weight of 600 or less, particularly those having a molecular weight of 50 to 500, and maleic acid, malonic acid, succinic acid, and itaconic acid are particularly preferable.

Examples of the organic carboxylic anhydride include aliphatic carboxylic anhydride and aromatic carboxylic anhydride. Specific examples thereof include aliphatic carboxylic anhydrides such as acetic anhydride, trichloroacetic anhydride, trifluoroacetic anhydride, tetrahydrophthalic anhydride, succinic anhydride, maleic anhydride, citraconic anhydride, itaconic anhydride, glutaric anhydride, 1,2-cyclohexenedicarboxylic anhydride, n-octadecylsuccinic anhydride, and 5-norbornene-2,3-dicarboxylic anhydride. Examples of the aromatic carboxylic anhydride include phthalic anhydride, trimellitic anhydride, pyromellitic anhydride, and naphthalic anhydride. Among these, those having a molecular weight of 600 or less, particularly having a molecular weight of 50 to 500, specifically, for example, maleic anhydride, succinic anhydride, citraconic anhydride, and itaconic anhydride are particularly preferable.

The amount of these organic carboxylic acids and/or organic carboxylic anhydrides to be added is usually in the range of 0.01% by mass to 10% by mass, preferably 0.03% by mass to 5% by mass, and more preferably 0.05% by mass to 3% by mass, with respect to the total solid content of the composition.

By adding these organic carboxylic acids and/or the organic carboxylic anhydrides having a molecular weight of 1,000 or less, it is possible to further reduce the amount of the residual undissolved substance of the composition while maintaining high pattern adhesiveness.

<Other Components>

The composition of the present invention may contain, if desired, various additives including a chain transfer agent such as alkyl N,N-dialkylamino benzoate ester and 2-mercapto benzothiazole, a thermal polymerization initiator such as an azo-based compound and a peroxide-based compound, a thermal polymerization component, a polyfunctional thiol or epoxy compound for the purpose of improving the strength and the sensitivity of a film, an ultraviolet absorbent such as alkoxy benzophenone, a plasticizer such as dioctyl phthalate, a developability improving agent such as a low-molecular-weight organic carboxylic acid, other fillers, polymer compounds other than the specific binder and the alkali-soluble resin as described above, an antioxidant, and an anti-aggregation agent.

Moreover, in order to improve the curing degree of a film by post-heating after development, a thermal curing agent may be added. Examples of the thermal curing agent include a thermal polymerization initiator such as an azo compound or a peroxide; a novolac resin, a resol resin, an epoxy compound, and a styrene compound.

The composition of the present invention is preferably prepared using the green colorant, the near-infrared absorbent, and the polymerizable compound as described above, other components that are used depending on the purposes, and an organic solvent.

The composition of the present invention can be applied to a color filter for a liquid crystal display device, a printing ink, an ink jet ink, and the like, in addition to a color filter production for use in a solid-state imaging device.

Even though the composition of the present invention contains a fine pigment at a high concentration, the pigment dispersion liquid stability and the developability are excellent, and thus, a colored region having good color characteristics can be formed with high precision. From this viewpoint, the effects can be said to remarkable even in the case of production of a color filter for a solid-state imaging device, in particular, formation of a pixel having a film thickness 0.8 µm or less, and preferably in the range of 0.1 µm to 0.5 µm.

The composition of the present invention has excellent dispersion stability, and therefore, in the case where it is applied to uses for formation of a liquid crystal display element having excellent color reproducibility and a color filter provided with a solid-state imaging device having excellent resolution, a thin film can be advantageously formed. As a result, it is preferable to prepare the composition in an aspect in which a green colorant is contained at a high concentration in this application.

The concentration of the colorant in the composition of the present invention is preferably 40% by mass or more, and more preferably 45% by mass or more, with respect to the total solid content (that is, a pigment, a dispersant, a binder, a polymerizable compound, a photopolymerization initiator, and other additives, the total mass of the components excluding a solvent) of the composition.

<Color Filter and Method for Manufacturing the Same>

Next, the color filter and the method for manufacturing the same of the present invention will be described.

The color filter of the present invention may have a colored film (green filter segment) formed by using the composition of the present invention on a substrate.

Hereinafter, the color filter in the present invention will be described in detail with respect to a method for manufacturing the same (method for manufacturing the color filter of the present invention).

Furthermore, the color filter in the present invention has a colored film formed by using the composition of the present invention, and the film thickness of the colored cured film is preferably 1.0 µm or less, more preferably 0.1 µm to 0.9 µm, and still more preferably 0.2 µm to 0.8 µm.

It is preferable to set the film thickness to 1.0 µm or less since high resolution and high adhesiveness can be obtained.

The method for manufacturing the color filter of the present invention has a step of forming a colored pattern on a substrate by applying the pattern forming method of the present invention.

That is, it is preferable that the method for manufacturing the color filter of the present invention includes a step of applying the composition of the present invention onto a substrate to form a composition layer (colored layer) (a composition layer forming step), a step of exposing the composition layer patternwise (an exposing step), and a step of developing the exposed composition layer to form a colored pattern (a developing step). Hereinafter, each of the steps will be described in detail.

<Composition layer Forming Step>

In the colored layer forming step, the composition of the present invention is coated on a substrate to form a composition layer (colored layer) composed of the composition.

Examples of the substrate which can be used in this step include a photoelectric conversion element substrate in a charge coupled device (CCD) or a complementary metal oxide film semiconductor (CMOS), which are used in a solid-state imaging device; a silicon substrate and the like; and alkali-free glass, soda glass, PYREX (registered trademark) glass, quartz glass, and these glasses to which a transparent conductive film is attached and the like, which are used in a liquid crystal display device or the like. In some cases, a black matrix which isolates each pixel may be formed on the substrate.

In addition, if desired, an undercoat layer may be provided on the substrate in order to improve adhesiveness to the upper layer, to prevent the diffusion of substance, or to planarize the substrate surface.

As to the method for applying the colored radiation-sensitive composition according to the present invention onto the substrate, various coating methods such as slit coating, an ink jet method, spin coating, cast coating, roll coating, and a screen printing method can be applied.

Drying (prebaking) of the composition layer (colored layer) coated on the substrate can be carried out at a temperature of 50° C. to 140° C. for 10 seconds to 300 seconds, using a hot plate, an oven, or the like.

From the viewpoint of securing color density and the viewpoint of reducing problems, for example, in that light in the oblique direction does not reach a light receiving unit, and thus, the difference in the light collection efficiency between the end and the center of a device becomes significant, the coating film thickness after drying the composition layer (hereinafter suitably referred to as a "dried film thickness") is preferably from 0.05 µm to less than 2.0 µm, more preferably from 0.1 µm to 1.5 µm, and particularly preferably from 0.2 µm to 1.0 µm.

<Exposing Step>

In the exposing step, the composition layer (colored layer) formed in the composition forming step is exposed patternwise.

For the exposure of the present step, the exposure of the composition layer is preferably carried out by performing the exposure through a predetermined mask pattern, and curing of to only the colored layer portion that has been irradiated with light. As the radiation which can be used during the exposure, in particular, radiation such as a g-line, a h-line, and an i-line is preferably used. The irradiation dose is preferably 30 mJ/cm$^2$ to 1,500 mJ/cm$^2$, more preferably 50 mJ/cm$^2$ to 1,000 mJ/cm$^2$, and most preferably 80 mJ/cm$^2$ to 500 mJ/cm$^2$.

<Developing Step>

Following the exposing step, an alkali development treatment (development step) is carried out to elute the uncured portion in a developer after the exposure while remaining the photo-cured portion. By this developing step, a patterned film composed of a colored film (green filter segment) can be formed.

The developing method may be any of a dip method, a shower method, a spray method, a paddle method, and the like, and a swing method, a spin method, an ultrasonic method, and the like may be combined therewith.

Before contacting the developer, the surface to be developed may be moisten with water or the like in advance to prevent development unevenness.

As the developer, an organic alkali developer which does not cause damage to underlying circuits and the like is preferable. The developing temperature is usually 20° C. to 30° C., and the developing time is 20 seconds to 90 seconds.

Examples of the alkali agent included in the developer include organic alkaline compounds such as aqueous ammonia, ethylamine, diethylamine, dimethylethanolamine, tetramethylammonium hydroxide, tetraethylammonium hydroxide, choline, pyrrole, piperidine, and 1,8-diazabicyclo-[5,4,0]-7-undecene, and inorganic alkaline compounds such as sodium hydroxide, potassium hydroxide, sodium hydrogen carbonate, and potassium hydrogen carbonate.

As the developer, an aqueous alkaline solution prepared by diluting with pure water so as to have a concentration of the alkali agent of 0.001% by mass to 10% by mass, and preferably 0.01% by mass to 1% by mass is preferably used. Further, in the case of using a developer composed of such an aqueous alkaline solution, the development is usually followed by cleaning (rinsing) with pure water.

Subsequently, the excess developer is removed by cleaning, and drying is carried out.

Furthermore, the production method of the present invention may also include a curing step in which the colored pattern formed is cured by post-heating (postbaking) or post exposure, if desired, after carrying out the composition layer forming step, the exposing step, and the developing step as described above are carried out. The postbaking is a heating treatment after the development in order to complete the curing, and a heat curing treatment which is generally 100° C. to 270° C. is carried out. In the case of using light, curing can be carried out using a g-line, a h-line, an i-line, an excimer laser such as KrF and ArF, an electron beam, X-rays, or the like, but it is preferable to carry out the curing using an existing high-pressure mercury lamp at a low temperature of approximately 20° C. to 50° C. The irradiation time is 10 seconds to 180 seconds, and preferably 30 seconds to 60 seconds. In the case of carrying out the post exposure and the post heating in combination, it is preferable to carry out the post exposure first.

By carrying out the composition layer forming step, the exposing step, and the developing step (further, if desired, the curing step) as described above, a desired color filter is manufactured.

The color filter according of the present invention manufactured by the method for manufacturing the color filter of the present invention can be used in a solid-state imaging device such as a CCD and a CMOS, and can also be suitably used in an image display device such as an electron paper and an organic EL, a liquid crystal display device, and the like. Particularly, the color filter is suitable for a solid-state imaging device such as a CCD and a CMOS having high resolution of more than one million pixels. The color filter of the present invention can be used as a color filter which is disposed, for example, between a light receiving unit of each pixel consisting a CCD element and a micro-lens for light collection.

EXAMPLES

Hereinbelow, the present invention will be described in more detail with reference to Examples of the present invention. Further, the materials, amounts used, proportions, treatment details, treatment procedures, and the like shown in the following Examples can be modified as appropriate without departing from the spirit of the present invention.

Therefore, the scope of the present invention is not intended to be limited to the specific examples shown below.

Example 1

<Preparation of Pigment Dispersion Liquid>

A mixed solution obtained by adding 625 parts by mass of propylene glycol 1-monomethyl ether 2-acetate (PGMEA) to 55 parts by mass of C. I. Pigment•Green 36 (PG36), 4 parts by mass of C. I. Pigment•Yellow 150(PY150), and 25 parts of the following dispersion resin (I) was mixed and dispersed for 3 hours by a beads mill (zirconia beads having a diameter of 0.3 mm) to prepare a pigment dispersion liquid.

~Synthesis of Dispersion Resin (I)~
(1. Synthesis of Polyester (i))

5.1 g of n-octanoic acid, 200 g of E-caprolactone, and 5 g of titanium (IV) tetrabutoxide were mixed and heated at 160° C. for 8 hours, and then cooled to room temperature to obtain a polyester (i) (weight-average molecular weight: 18,000, number-average molecular weight: 14,000). The scheme is shown below.

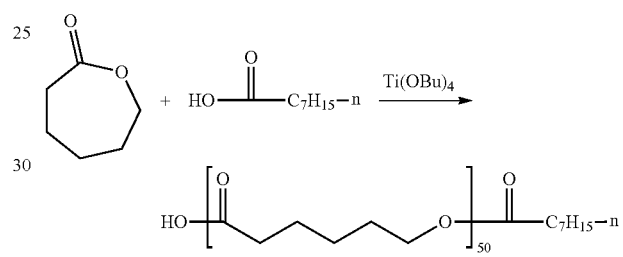

(2. Synthesis of Dispersion Resin (I))

15 g of polyethylenimine (SP-012, number-average molecular weight of 1,200, manufactured by Nippon Shokuhai Co., Ltd.) and 100 g of the polyester (i) were mixed and heated at 120° C. for 3 hours to obtain an intermediate. Thereafter, the mixture was cooled to 65° C., 200 g of propylene glycol 1-monomethyl ether 2-acetate (PGMEA) containing 0.5 g of succinic anhydride was slowly added thereto, and the mixture was stirred for 2 hours. Thereafter, PGMEA was added thereto to obtain a 10% by mass solution of the dispersion resin (I) in PGMEA. The dispersion resin (1) has a side chain derived from the polyester (i) and a group having a functional group (carboxyl group) with a pKa of 14 or less, derived from succinic anhydride. Further, the weight-average molecular weight was 18,000.

<Preparation of Coloring Composition>

Using the pigment dispersion liquid, all the components were mixed and stirred to have the following compositional ratio, thereby preparing a coloring composition. Further, the mass ratio (the mass of the green colorant/the mass of the near-infrared absorbent) in the coloring composition was 0.2.

(Composition)

| | |
|---|---|
| Pigment dispersion liquid above | 52.5 parts by mass |
| Pyrrolopyrrole compound shown below | 19.0 parts by mass |
| Photopolymerization initiator (IRGACURE OXE01 [2-(o-benzoyloxime)-1-[4-(phenylthio)phenyl]-1,2-octanedione], manufactured by BASF) | 1.0 parts by mass |
| Dipentaerythritol pentaacrylate (manufactured by Nippon Kayaku Co., Ltd.), product name: KAYARAD DPHA) | 3.5 parts by mass |

-continued

| | |
|---|---|
| Alkali-soluble resin (methacrylic acid benzyl/methacrylic acid/methacrylic acid-2-hydroxyethyl copolymer (=60/22/18 [molar ratio]), weight-average molecular weight: 15,000, number-average molecular weight: 8,000) | 2.1 parts by mass |
| F-475 (manufactured by Dainippon Ink & Chemicals, Inc.; fluorine-based surfactant) | 0.01 parts by mass |
| o-Methoxyphenol (polymerization inhibitor) | 0.002 parts by mass |
| Propylene glycol monomethyl ether acetate | 25.0 parts by mass (PGMEA; solvent) |

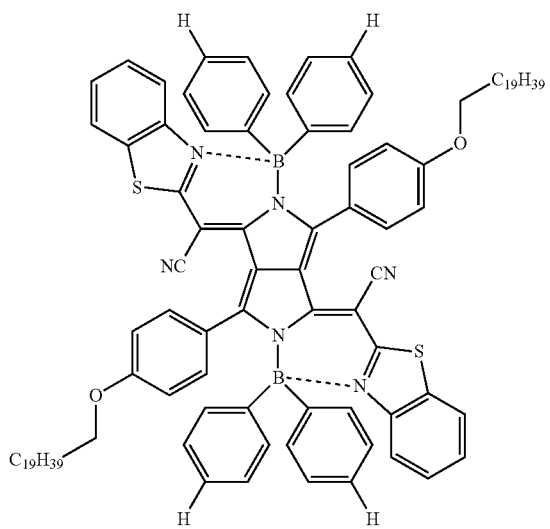

The pyrrolopyrrole compound was synthesized according to the following scheme. More specifically, a diketopyrrolopyrrole compound (DPP) was synthesized by using 4-(nonadecacyloxy)benzonitrile as a raw material according to the method described in U.S. Pat. No. 5,969,154A.

Scheme 1

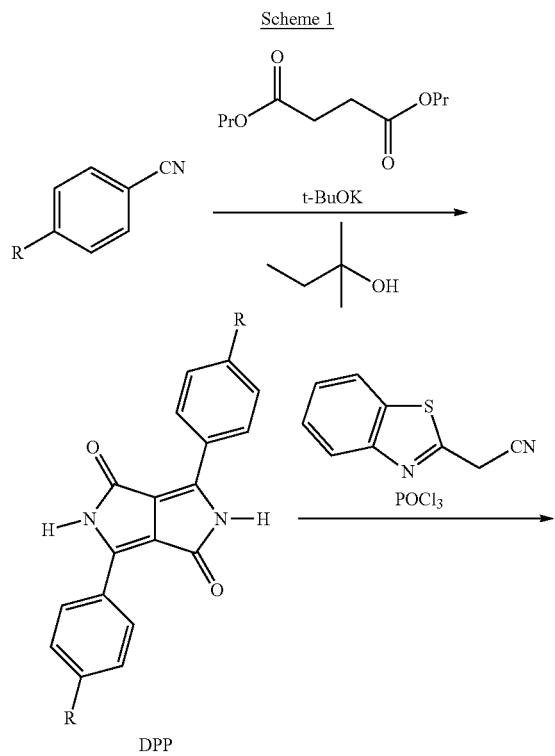

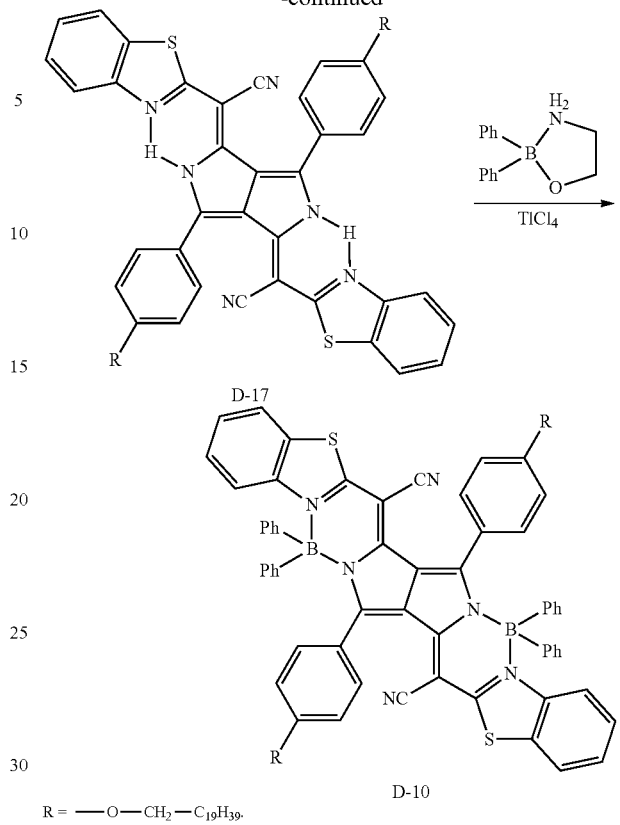

$R = -O-CH_2-C_{19}H_{39}$.

Comparative Example 1

Using the pigment dispersion liquid, all the components were mixed and stirred to have the following compositional ratio, thereby preparing a coloring composition (comparative composition). This coloring composition does not include a near-infrared absorbent.

(Composition)

| | |
|---|---|
| Pigment dispersion liquid above | 63 parts by mass |
| Photopolymerization initiator (IRGACURE OXE01 [2-(o-benzoyloxime)-1-[4-(phenylthio)phenyl]-1,2-octanedione], manufactured by BASF) | 1.2 part by mass |
| Dipentaerythritol pentaacrylate (manufactured by Nippon Kayaku Co., Ltd.), product name: KAYARAD DPHA) | 4.2 parts by mass |
| Alkali-soluble resin (methacrylic acid benzyl/methacrylic acid/methacrylic acid-2-hydroxyethyl copolymer (=60/22/18 [molar ratio]), weight-average molecular weight: 15,000, number-average molecular weight: 8,000) | 2.5 parts by mass |
| F-475 (manufactured by Dainippon Ink & Chemicals, Inc.; fluorine-based surfactant) | 0.01 parts by mass |
| o-Methoxyphenol (polymerization inhibitor) | 0.002 parts by mass |
| Propylene glycol monomethyl ether acetate | 30.0 parts by mass (PGMEA; solvent) |

The coloring composition prepared above was coated on a glass substrate using a spin coater (manufactured by Mikasa Co., Ltd.) to form a coating film. Further, the thickness of the coating film was adjusted such that the thickness (average thickness) of the colored film became 0.8

μm. Next, the coating film was subjected to a heating treatment (prebaking) for 120 seconds using a hot plate at 100° C.

Next, the coating film was exposed with a light at a wavelength of 365 nm was carried out at 1,000 mJ/cm$^2$, using an i-line stepper exposure device FPA-3000i5+(manufactured by Canon Inc.).

In addition, the coating film was subjected to a heating treatment (postbaking) for 5 minutes using a hot plate at 200° C. to obtain a colored film (having a film thickness of 0.8 μm).

(Evaluation of Incident-Angle Dependence)

The incident-angle dependence of the colored film obtained above was measured using U-4100 (manufactured by Hitachi High-Technologies Corporation.). Specifically, the measurement wavelength range was in the range of 400 nm to 1,200 nm, the surface normal direction of the colored film was changed to 0°, and the incident angle was changed to 0°, 20°, and 40° to measure the transmittance of the colored film at each angle. The obtained measurement results were evaluated according to the following criteria.

More specifically, the transmittance X (%) at a wavelength of 750 nm when measured at an incident angle of 0° and the wavelength position Y nm nearest from the wavelength of 750 nm, to yield the transmittance X (%), when measured at an incident angle of 20° or 40° were compared, and the sizes of absolute values of the difference (shift) from |750−Y| were evaluated.

"A": A case where the absolute value of the difference (shift) from |750−Y| is less than 10 nm "B": A case where the absolute value of the difference (shift) from |750−Y| is from 10 nm to less than 20 nm "C": A case where the absolute value of the difference (shift) from |750−Y| is 20 nm or more The evaluation results of the colored films obtained using the coloring compositions obtained in Example 1 and Comparative Example 1 are shown in Table 3.

Figure 2:
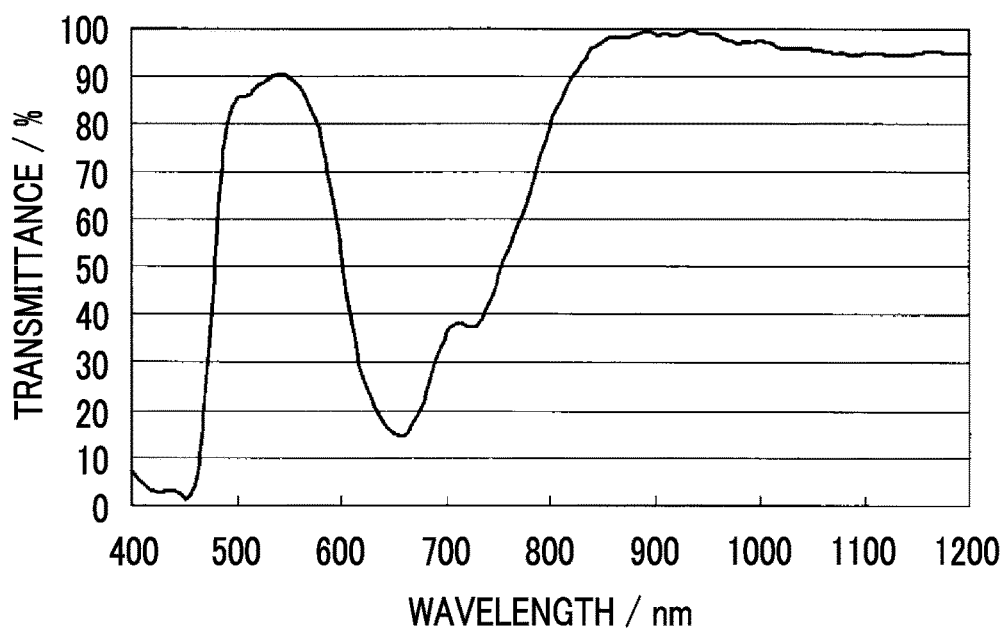
FIG. 2 is a transmission spectrum view of a colored film obtained in Comparative Example 1.

Furthermore, the transmission spectral diagrams of the colored films of Example 1 and Comparative Example 1, measured at an incident angle of 0°, are shown in FIGS. 1 and 2, respectively.

In addition, the "green colorant/near-infrared absorbent (mass ratio)" represents the mass ratio of C. I. Pigment•Green 36 to the pyrrolopyrrole compound.

the transmittance at a wavelength from 400 nm to 450 nm and a wavelength from 600 nm to less than 700 nm can be reduced, and thus, the image quality of the image sensor is improved. In addition, by using the image sensor, the incident-angle dependence is low, and excellent image quality is obtained even when an inexpensive near-infrared ray-cutting filter is used in a camera module.

On the other hand, in Comparative Example 1 in which the conditions for a predetermined transmittance were not met, desired effects could not be obtained.

According to the same procedure as above except that the coloring composition obtained in Example 1 was used instead of the coloring curable composition G-2 for green (G) of Example 100 described in paragraphs "0288" to "0293" of JP2013-237816A, a color filter for a solid-state imaging device was manufactured.

The obtained full-color color filter was assembled into a solid-state imaging device, and it was thus found that the obtained solid-state imaging device X has high resolution and excellent color-separation properties.

On the other hand, according to the same procedure as above except that the coloring composition obtained in Comparative Example 1 was used instead of the coloring composition obtained in Example 1, a color filter was manufactured, and a solid-state imaging device Y was manufactured. It was thus found that the color-separation properties was deteriorated, as compared with those of the solid-state imaging device X.

Moreover, in Example 1, even in the cases (Examples 2 to 5) where the mass ratio of C. I. Pigment•Green 36 to the pyrrolopyrrole compound (the mass of the green colorant/the mass of the near-infrared absorbent) was changed to 0.1, 0.5, 1, or 3, the same excellent effects were obtained, as described above. In addition, there was tendency that when the content of the near-infrared absorbent was low, the incident-angle dependence was deteriorated.

Furthermore, it could be seen that there is tendency that when the content of the near-infrared absorbent is too high, the color-separation properties of the solid-state imaging device are deteriorated.

When the mass ratio of C. I. Pigment•Green 36 to the pyrrolopyrrole compound was changed in Examples 2 to 5, the total amount of the both was set to the same as the total amount of the both in Example 1.

TABLE 3

| | Green colorant/ near-infrared absorbent (mass ratio) | Transmittance | | | | Evaluation of incident-angle dependence | |
|---|---|---|---|---|---|---|---|
| | | Maximum transmittance (400 nm to 450 nm) | Maximum transmittance (500 nm to 600 nm) | Minimum transmittance (650 nm to less than 700 nm) | Minimum transmittance (700 nm to 900 nm) | Incident angle 20° | Incident angle 40° |
| Example 1 | 0.2 | 4% | 83% | 9% | 1% | A | A |
| Example 2 | 0.1 | 2% | 76% | 1% | 0% | A | A |
| Example 3 | 0.5 | 5% | 87% | 10% | 6% | A | B |
| Example 4 | 1.0 | 5% | 89% | 13% | 19% | A | B |
| Example 5 | 3.0 | 5% | 90% | 14% | 30% | B | B |
| Comparative Example 1 | — | 7% | 90% | 15% | 36% | B | C |

As shown in Table 3, the colored film obtained from the coloring composition of the present invention was found to have near-infrared ray-cutting properties and small incident-angle dependence degree.

Furthermore, if the colored film is used, as described later, the color separation of the color filter is improved that in that Moreover, even in the case where IRGACURE OXE01 as a photopolymerization initiator was changed to IRGACURE OXE02 and the case where A-DPH-12E as a polymerizable compound (polymerizable monomer) was changed to KAYARAD D-330, KAYARAD D-320, KAYARAD D-310, or KAYARAD DPHA, in Example 1, the same excellent effects as in Example 1 were obtained.

Furthermore, even in the case where the pyrrolopyrrole compound was changed to the compound I-17 obtained in Synthesis Example 1 below or the compound I-22 obtained in Synthesis Example 2 below, the same excellent effects as in Example 1 were obtained. In addition, or the compound I-22 obtained in Synthesis Example 2 is more preferable since it has a maximum absorption wavelength of 700 nm and has less shielding in the visible light region, and compounds having a long-wavelength maximum absorption wavelength are more preferable.

(Synthesis Example 1) Synthesis of Compound I-17

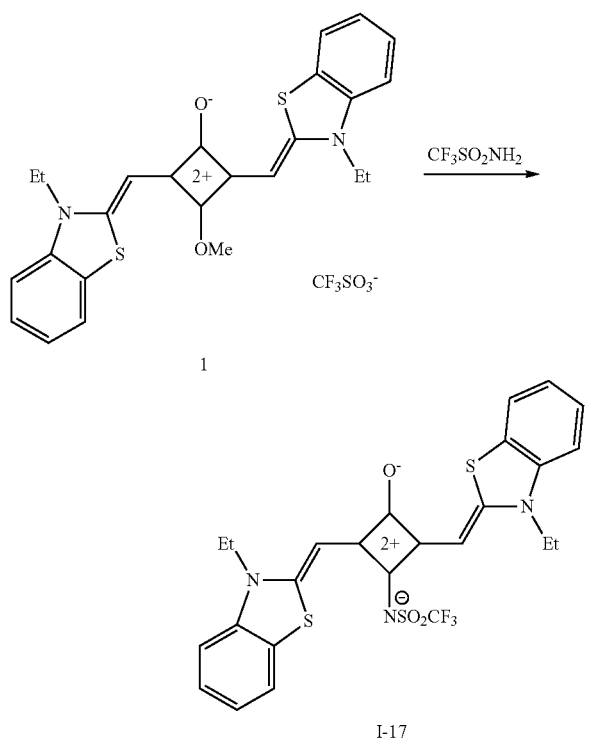

A raw material 1 was synthesized according to the method described in literature (Helvetica Chimica Acta, Vol. 88, pp. 1135-1143, 2005).

The raw material 1 (0.4 g) and trifluorosulfonamide (manufactured by Tokyo Kaseihin Co., Ltd.) (0.21 g) were dissolved in chloroform (20 ml), and triethylamine (0.1 g) and a catalytic amount of dimethylaminopyridine were added thereto. Under stirring, the mixture was heated and refluxed for 3 days, and cooled. The obtained crude crystal was separated by filtration and purified by silica gel chromatography (eluant: chloroform, methanol) to obtain a desired compound (blue solid) I-17. The yield was 55%.

$^1$H-NMR (nuclear magnetic resonance) (400 MHz, DMSO (dimethyl sulfoxide)-d6); δ 1.30 (t, 6H), 4.22 (d, 4H), 4.90 (s, 2H), 7.18 (d, 2H), 7.30 (t, 2H), 7.38 (d, 2H), 7.85 (d, 2H)

Absorption spectrum (DMSO): maximum absorption wavelength of 670 nm (Synthesis Example 2) Synthesis of Compound I-22

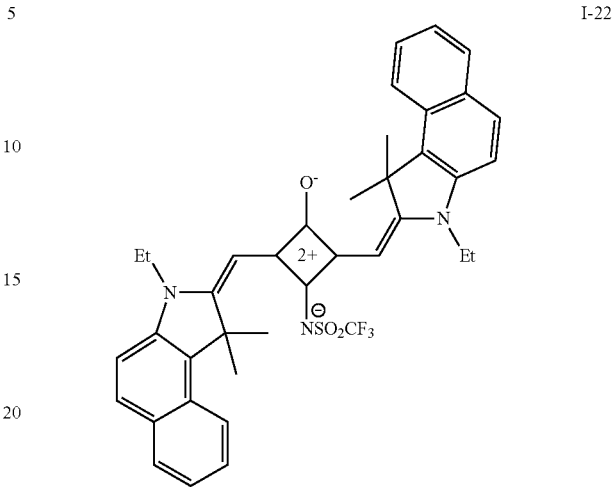

In the same manner as in Synthesis Example 1, a compound I-22 was synthesized.

$^1$H-NMR (400 MHz, DMSO-d6); δ 1.23 (t, 6H), 4.30 (d, 4H), 4.70 (s, 2H), 7.20 (d, 2H), 7.58 (t, 2H), 7.90 (d, 2H), 8.05 (d, 2H), 8.20 (d, 2H)

Absorption spectrum (DMSO): a maximum absorption wavelength of 700 nm

Furthermore, also in the case where the pyrrolopyrrole compound was changed to the compound (A-154) (a compound including a branched alkyl group) of Examples of WO2014/199937A, the same excellent effects as in Example 1 were obtained. In particular, in the case of using the compound (A-154), the coating liquid was easily prepared, and the smoothness of the film when a film was formed by applying the coating liquid was improved.

What is claimed is:

1. A green coloring composition for use in a color filter, comprising a green colorant, a near-infrared absorbent, and a polymerizable compound, wherein
   when the coloring composition is used to form a colored film having a film thickness of 0.8 μm,
   the maximum value of the transmittance at a wavelength from 400 nm to 450 nm of the colored film is 5% or less,
   the maximum value of the transmittance at a wavelength from 500 nm to 600 nm of the colored film is 70% or more,
   the minimum value of the transmittance at a wavelength from 650 nm to less than 700 nm of the colored film is 20% or less,
   the minimum value of the transmittance at a wavelength from 700 nm to 900 nm of the colored film is 30% or less, and
   wherein the mass ratio of the green colorant to the near-infrared absorbent is 0.1 to 0.4, in which the mass ratio represents the mass of the green colorant/the mass of the near-infrared absorbent.

2. The green coloring composition for use in a color filter according to claim 1, wherein the maximum value of the transmittance at a wavelength from 400 nm to 450 nm of the colored film is 4% or less.

3. The green coloring composition for use in a color filter according to claim 2, wherein the maximum value of the transmittance at a wavelength from 500 nm to 600 nm of the colored film is 75% or more.

4. The green coloring composition for use in a color filter according to claim 2, wherein the minimum value of the transmittance at a wavelength from 650 nm to less than 700 nm of the colored film is 15% or less.

5. The green coloring composition for use in a color filter according to claim 2, wherein the minimum value of the transmittance at a wavelength from 700 nm to 900 nm of the colored film is 20% or less.

6. The green coloring composition for use in a color filter according to claim 1, wherein the maximum value of the transmittance at a wavelength from 500 nm to 600 nm of the colored film is 75% or more.

7. The green coloring composition for use in a color filter according to claim 6, wherein the minimum value of the transmittance at a wavelength from 650 nm to less than 700 nm of the colored film is 15% or less.

8. The green coloring composition for use in a color filter according to claim 6, wherein the minimum value of the transmittance at a wavelength from 700 nm to 900 nm of the colored film is 20% or less.

9. The green coloring composition for use in a color filter according to claim 1, wherein the minimum value of the transmittance at a wavelength from 650 nm to less than 700 nm of the colored film is 15% or less.

10. The green coloring composition for use in a color filter according to claim 9, wherein the minimum value of the transmittance at a wavelength from 700 nm to 900 nm of the colored film is 20% or less.

11. The green coloring composition for use in a color filter according to claim 1, wherein the minimum value of the transmittance at a wavelength from 700 nm to 900 nm of the colored film is 20% or less.

12. The green coloring composition for use in a color filter according to claim 1, wherein the near-infrared absorbent includes a pyrrolopyrrole compound or a squarylium compound.

13. A colored film obtained by curing the green coloring composition for use in a color filter according to claim 1.

14. A color filter comprising the colored film according to claim 13.

15. A solid-state imaging device comprising the color filter according to claim 14.

16. The green coloring composition for use in a color filter according to claim 1, wherein the near-infrared absorbent includes a pyrrolopyrrole compound.

17. The green coloring composition for use in a color filter according to claim 1, wherein the near-infrared absorbent includes a squarylium compound.

18. The green coloring composition for use in a color filter according to claim 1, wherein the content of the green colorant contained in the composition is 5% by mass to 20% by mass with respect to the total solid content of the composition.

19. The green coloring composition for use in a color filter according to claim 1, wherein the content of the near-infrared absorbent contained in the composition is 10% by mass to 65% by mass with respect to the total solid content of the composition.

* * * * *